US012581689B2

(12) United States Patent
Chang et al.

(10) Patent No.: US 12,581,689 B2
(45) Date of Patent: Mar. 17, 2026

(54) MULTI-GATE SEMICONDUCTOR DEVICE AND FABRICATION METHOD THEREOF

(71) Applicant: Taiwan Semiconductor Manufacturing Company, Ltd., Hsin-Chu (TW)

(72) Inventors: Cheng-Wei Chang, Taipei City (TW); Shahaji B. More, Hsinchu City (TW); Yi-Ying Liu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 869 days.

(21) Appl. No.: 17/721,432

(22) Filed: Apr. 15, 2022

(65) Prior Publication Data

US 2023/0118990 A1 Apr. 20, 2023

Related U.S. Application Data

(60) Provisional application No. 63/256,049, filed on Oct. 15, 2021.

(51) Int. Cl.
| | |
|---|---|
| *H01L 29/423* | (2006.01) |
| *H10D 30/01* | (2025.01) |
| *H10D 30/67* | (2025.01) |
| *H10D 62/10* | (2025.01) |
| *H10D 84/01* | (2025.01) |
| *H10D 84/03* | (2025.01) |

(52) U.S. Cl.
CPC ....... *H10D 30/6735* (2025.01); *H10D 30/031* (2025.01); *H10D 30/6713* (2025.01); *H10D 30/6757* (2025.01); *H10D 62/118* (2025.01); *H10D 84/0128* (2025.01); *H10D 84/038* (2025.01)

(58) Field of Classification Search
None
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |

(Continued)

*Primary Examiner* — Long Pham
(74) *Attorney, Agent, or Firm* — HAYNES AND BOONE, LLP

(57) ABSTRACT

A method of manufacturing a semiconductor device includes alternately stacking first semiconductor layers and second semiconductor layers over a substrate, patterning the first and second semiconductor layers into a fin structure, forming a dielectric layer across the fin structure, and removing the first semiconductor layers of the fin structure thereby forming gaps between the second semiconductor layers of the fin structure. The method also includes depositing a first metal layer to wrap around the second semiconductor layers thereby forming voids between opposing sidewalls of the dielectric layer, recessing the first metal layer, forming a blocking layer over the recessed first metal layer thereby covering the voids, and depositing a second metal layer over the blocking layer.

20 Claims, 23 Drawing Sheets

(56)          References Cited

U.S. PATENT DOCUMENTS

| | | | |
|---|---|---|---|
| 9,236,300 B2 | 1/2016 | Liaw | |
| 9,520,482 B1 | 12/2016 | Chang et al. | |
| 9,576,814 B2 | 2/2017 | Wu et al. | |
| 10,937,789 B2 * | 3/2021 | Reznicek | H10B 12/0385 |
| 2019/0131396 A1 * | 5/2019 | Zhang | B82Y 10/00 |
| 2019/0393327 A1 | 12/2019 | Lin et al. | |
| 2021/0408246 A1 * | 12/2021 | Ganguly | H01L 21/02532 |
| 2024/0379444 A1 * | 11/2024 | Pao | H10D 30/43 |
| 2025/0006559 A1 * | 1/2025 | Li | H10D 30/024 |

* cited by examiner

10

12

118

116
114
116
114    112
116
114

110

111

12

12

100

Z

Y

X

MULTI-GATE SEMICONDUCTOR DEVICE AND FABRICATION METHOD THEREOF

PRIORITY DATA

This application claims priority to U.S. Provisional Patent Application No. 63/256,049 filed on Oct. 15, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate semiconductor devices have been introduced in an effort to improve gate control by increasing gate-channel coupling, reduce OFF-state current, and reduce short-channel effects (SCEs). One such multi-gate semiconductor device that has been introduced is the gate-all around transistor (GAA). The GAA device gets its name from the gate structure which extends around the channel region providing access to the channel region on four sides, which allows for fuller depletion in the channel region and results in less short-channel effects due to steeper sub-threshold current swing (SS) and smaller drain induced barrier lowering (DIBL). GAA devices are compatible with conventional complementary metal-oxide-semiconductor (CMOS) processes and their structure allows them to be aggressively scaled-down while maintaining gate control and mitigating SCEs. The GAA device provides a channel region in the form of stacked channel members. However, integration of fabrication of the GAA features around the channel members can be challenging. While the current methods have been satisfactory in many respects, as transistor dimensions are continually scaled down to sub-10 nm technology nodes, further improvements of the GAA devices are still needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
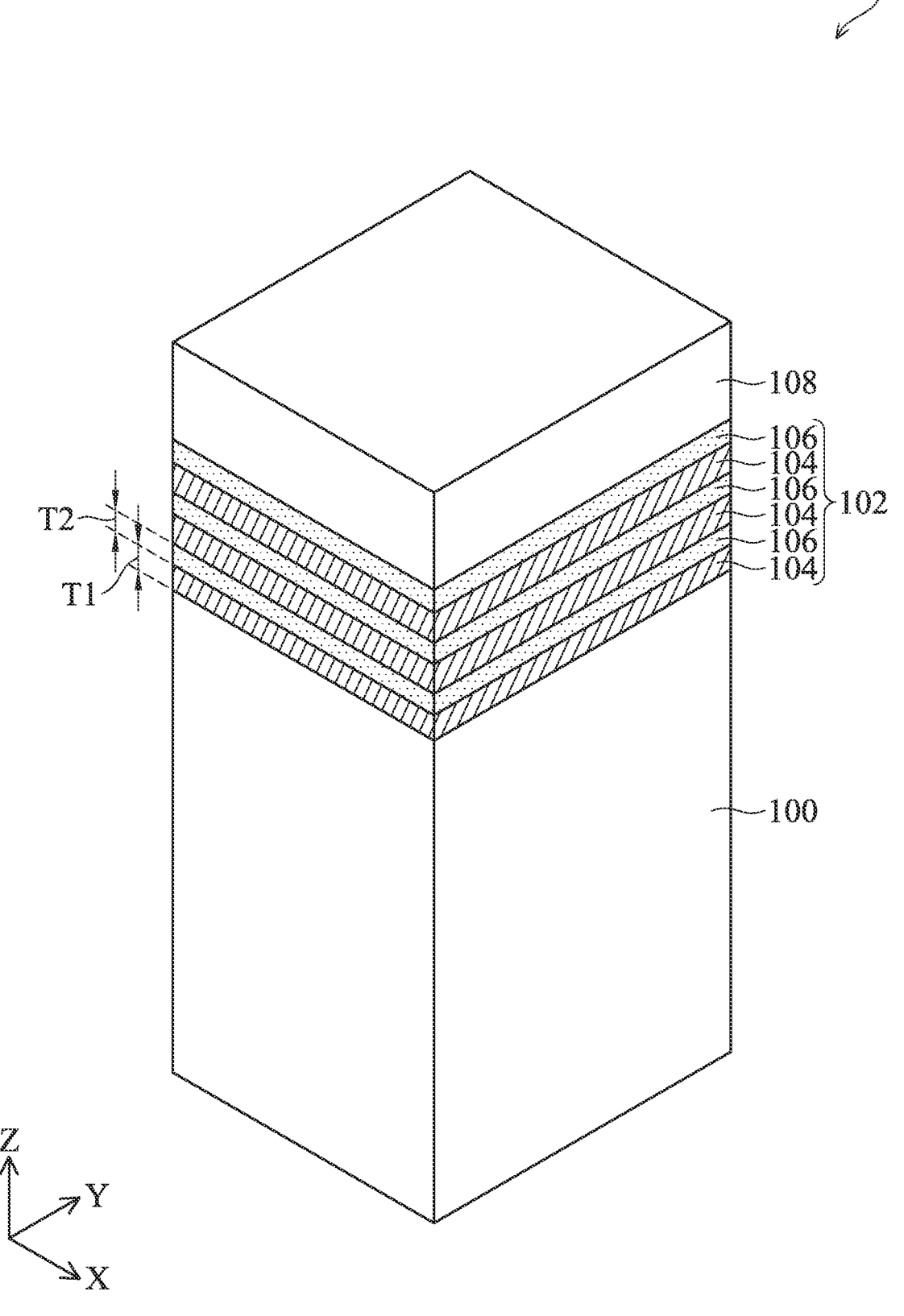
FIGS. 1, 2, 3, 4, 5, 6, 7, 8, 9, 10, 11, 12, 13, 14, and 15 illustrate perspective views of a semiconductor structure during a fabrication process, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within $+/-10\%$ of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating multi-gate devices. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on four sides of a channel region (e.g., surrounding a portion of a channel region). The channel region includes a stacked of channel members in the form of nanosheet, nanowire, bar, and/or other suitable channel configuration associated with a single, contiguous gate structure. However, one of ordinary skill would recognize that the teaching can apply to a single channel member (e.g., single nanowire/nanosheet) or any number of channel members. One of ordinary skill may recognize other examples of semiconductor devices that may benefit from aspects of the present disclosure.

With transistor dimensions are continually scaled down to sub-10 nm technology nodes and below, voids (or referred to as seams for their generally high aspect ratio) may be formed in a work function metal (WFM) layer during a replacement gate (or termed as "gate-last") process flow due to the ever-shrunk dimensions of a gate trench and limited gap filling capability of conductive materials used in forming the WFM layer. Interior space in the voids may open through the outer surface of the WFM layer and would be partially filled with impurities during subsequent manufacturing processes, such as metallic materials in forming a metal fill layer of a gate stack and/or other chemical compounds in subsequent etching and deposition processes. The proximity of impurities to the WFM layer causes WFM resistance shifting and transistor threshold voltage (Vt)

shifting, consequently degrading wafer acceptance test (WAT) performance. In accordance with some embodiments, a blocking layer is formed above the WFM layer to seal the voids. The blocking layer blocks unwanted impurities from entering the voids. In addition, the blocking layer may function as a glue layer in increasing adhesion to the metal fill layer which is subsequently deposited above the WFM layer. The blocking layer improves performance of the transistors, such as the uniformity of WFM resistance and threshold voltage.

FIGS. 1-23 are perspective views and cross-sectional views of a semiconductor device 10 at intermediate stages during the manufacturing process in accordance with some embodiments of the present disclosure. The semiconductor device 10 illustrated in the following embodiments may be applied to, but not limited thereto, a fin field-effect transistor (FinFET), gate-all-around (GAA) FET, or other transistors including a multi-gate.

Referring to FIG. 1, a substrate 100 is provided. In some embodiments, the substrate 100 includes a crystalline silicon substrate (e.g., wafer). The substrate 100 may include various doped regions (e.g., p-type well and/or n-type well) depending on design requirements. In some embodiments, the doped regions may be doped with p-type or n-type dopants. For example, the doped regions may be doped with p-type dopants, such as boron or $BF_2$, n-type dopants, such as phosphorus or arsenic, and/or combinations thereof. The doped regions may be configured for n-type transistors, or alternatively, configured for p-type transistors. In some embodiments, an anti-punch-through (APT) implantation is performed on a top portion of the substrate 100 to form an APT region. The conductivity type of the dopants implanted in the APT region is the same as that of the doped regions (or wells). The APT region may extend under the subsequently formed source/drain (S/D) regions 140 (FIG. 9), and are used to reduce the leakage from the S/D regions 140 to substrate 100. For clarity, the doped regions and the APT region are not illustrated in FIG. 1 and subsequent drawings. In some alternative embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

As shown in FIG. 1, a semiconductor stack 102 is formed on the substrate 100. The semiconductor stack 102 may include a plurality of first layers 104 and a plurality of second layers 106 stacked alternately in a Z-direction. Although only three first layers 104 and three second layers 106 are illustrated in FIG. 1, the embodiments of the present disclosure are not limited thereto. In other embodiments, the number of the first layers 104 and the second layers 106 are adjusted by the need, such as one, two, four, or more first layers 104 and second layers 106.

In some embodiments, the first layers 104 and the second layers 106 include different materials. For example, the first layers 104 are SiGe layers having a germanium atomic percentage in the range between about 15% and 40%, and the second layers 106 are Si layers free from germanium. However, the embodiment of the disclosure is not limited thereto, in other embodiments, the first layers 104 and the second layers 106 have materials with different etching selectivity. In some embodiments, the first layers 104 and the second layers 106 are formed by an epitaxial growth process, such as a molecular beam epitaxy (MBE) process, a metalorganic chemical vapor deposition (MOCVD) process, or the like. In the case, the first layers 104 are epitaxial SiGe layers, and the second layers 106 are epitaxial Si layers. In some alternative embodiments, the first layers 104 and the second layers 106 are formed by a suitable deposition, such as chemical vapor deposition (CVD), atomic layer deposition (ALD), or the like. In the case, the first layers 104 are poly-SiGe layers, and the second layers 106 are poly-Si layers.

The first layers 104 and the second layers 106 may have the same or different thicknesses. In some embodiments, the first layers 104 have the same thickness T1 and the second layers 106 have the same thickness T2. In some embodiments, the thickness T1 ranges from about 5 nm to about 20 nm and the second thickness T2 ranges from about 5 nm to about 20 nm. Alternatively, the top to bottom first layers 104 may have different thicknesses, and the top to bottom second layers 106 may have different thicknesses.

As shown in FIG. 1, a mask layer 108 is formed on the semiconductor stack 102. The mask layer 108 may include a single-layered structure, a two-layered structure, or a multi-layered structure. For example, the mask layer 108 includes a silicon oxide (SiO) layer and a silicon nitride (SiN) layer on the SiO layer. In some embodiments, the mask layer 108 is formed by CVD, ALD, or the like.

Figure 2:
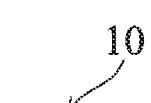

Referring to FIG. 2, the mask layer 108 is patterned to form a plurality of mask strips 118. The semiconductor stack 102 and the substrate 100 are then patterned by using the mask strips 118 as a mask, so as to form a plurality of trenches 12. In the case, a plurality of fin bases 111 and a plurality of stacks of semiconductor strips 112 on the fin bases 111 are formed between the trenches 12. The trenches 12 extend into the substrate 100, and have lengthwise directions parallel to each other. Herein, the stacks of semiconductor strips 112 are referred to as nanosheet stacks 112 and the combination of the fin bases 111 and the nanosheet stacks 112 thereon are referred to as fins 110. As shown in FIG. 2, the nanosheet stack 112 includes a plurality of first nanosheets 114 and a plurality of second nanosheets 116 stacked alternately along a Z-direction and extending along a Y direction.

In some embodiments, the fins 110 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 110.

Although only two fins 110 are illustrated in FIG. 2, the embodiments of the present disclosure are not limited thereto. In other embodiments, the number of the fins 110 may be adjusted by the need, such as one fin, three fins, four fins, or more fins. In addition, the mask strips 118 illustrated in FIG. 2 have flat top surfaces. However, the embodiments of the present disclosure are not limited thereto. In other embodiments, the mask strips 118 may have dome top surfaces due to the high aspect ratio etching.

Figure 3:
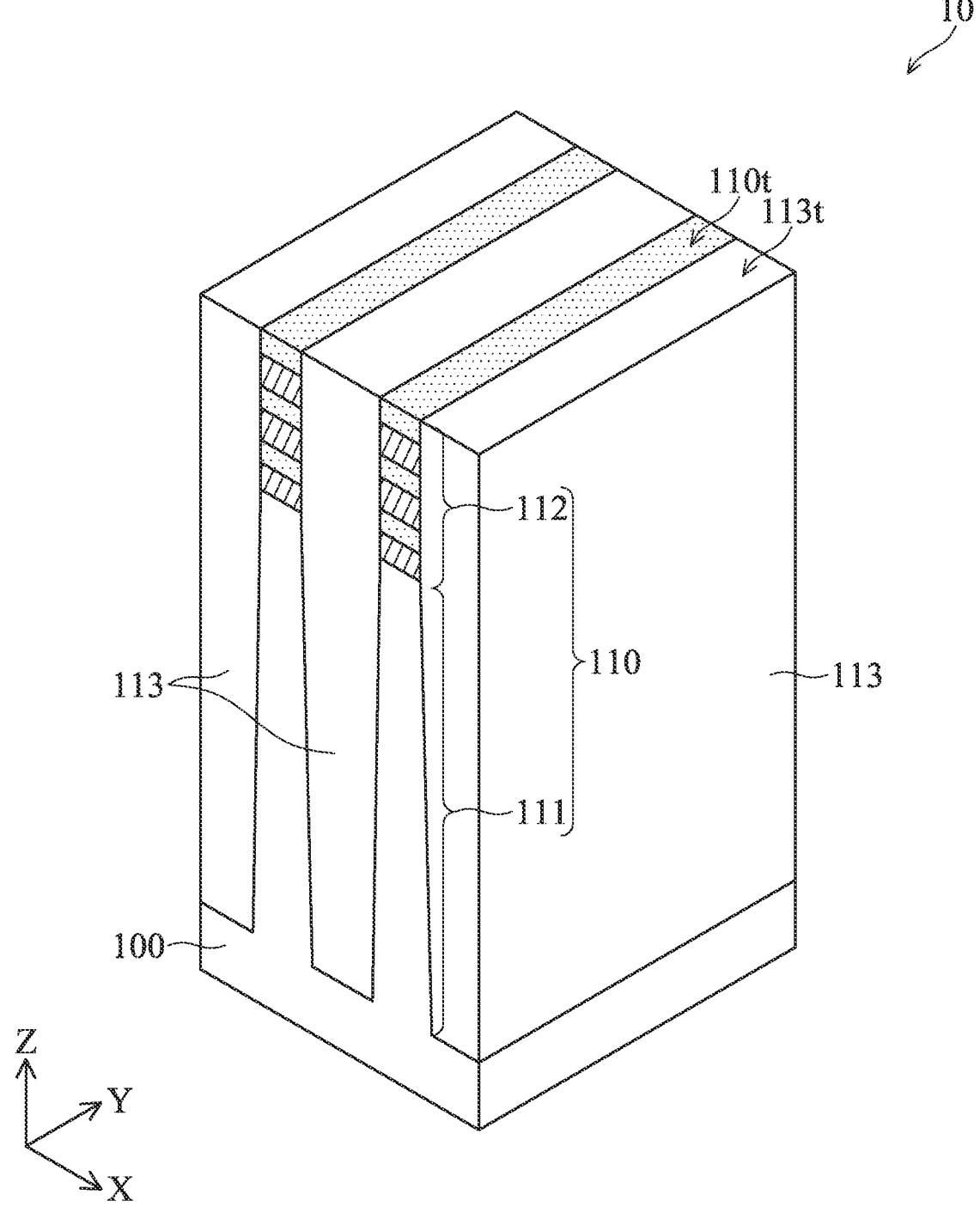

Referring to FIG. 3, an insulating layer 113 is formed in the trenches 12. In some embodiments, an insulating material is formed on the substrate 100 to cover the fins 110 and to fill up the trenches 12. In addition to the fins 110, the insulating material further covers the mask strips 118. The insulating material may include silicon oxide, silicon nitride, silicon oxynitride, a spin-on dielectric material, or a low-k dielectric material. Herein, the low-k dielectric materials are generally dielectric materials having a dielectric constant lower than 3.9. The insulating material may be formed by flowable chemical vapor deposition (FCVD), high-density-plasma chemical vapor deposition (HDP-CVD), sub-atmo-spheric CVD (SACVD), or spin on. A planarization process may be performed, to remove a portion of the insulating material and the mask strips 118 until the fins 110 are exposed. In the case, as shown in FIG. 3, top surfaces 110t of the fins 110 are substantially coplanar with a top surface 113t of the planarized insulating layer 113. In some embodiments, the planarization process includes a chemical mechanical polish (CMP), an etching back process, a combination thereof, or the like.

Figure 4:
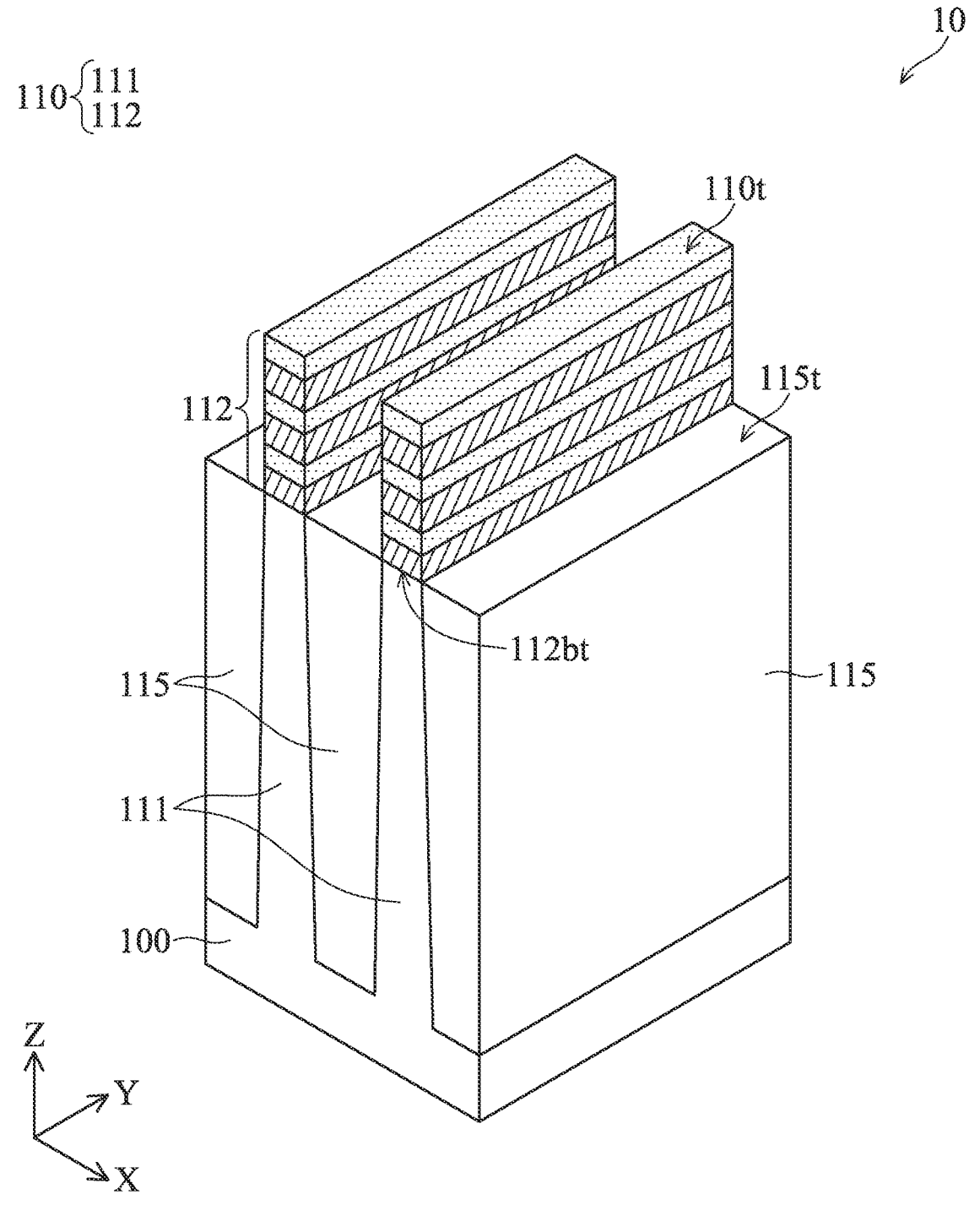

Referring to FIG. 4, the insulating layer 113 are recessed to form a plurality of isolation regions 115. After recessing the insulating layers 113, the fins 110 protrude from top surfaces 115t of the isolation regions 115. That is, the top surfaces 115t of the isolation regions 115 may be lower than the top surfaces 110t of the fins 110. In some embodiments, the nanosheet stacks 112 are exposed by the isolation regions 115. That is, the top surfaces 115t of the isolation regions 115 may be substantially coplanar with or lower than bottom surfaces 112bt of the nanosheet stacks 112. Further, the top surfaces 115t of the isolation regions 115 may have a flat surface as illustrated, a convex surface, a concave surface (such as dishing), or a combination thereof. In some embodiments, the insulating layers 113 are recessed by using an appropriate etching process, such as a wet etching process with hydrofluoric acid (HF), a dry etching process, or a combination thereof. In some embodiments, a height difference between the top surfaces 110t of the fins 110 and the top surfaces 115t of the isolation regions 115 ranges from about 30 nm to about 100 nm. In some embodiments, the isolation regions 115 may be shallow trench isolation (STI) regions, deep trench isolation (DTI) regions, or the like.

Figure 5:
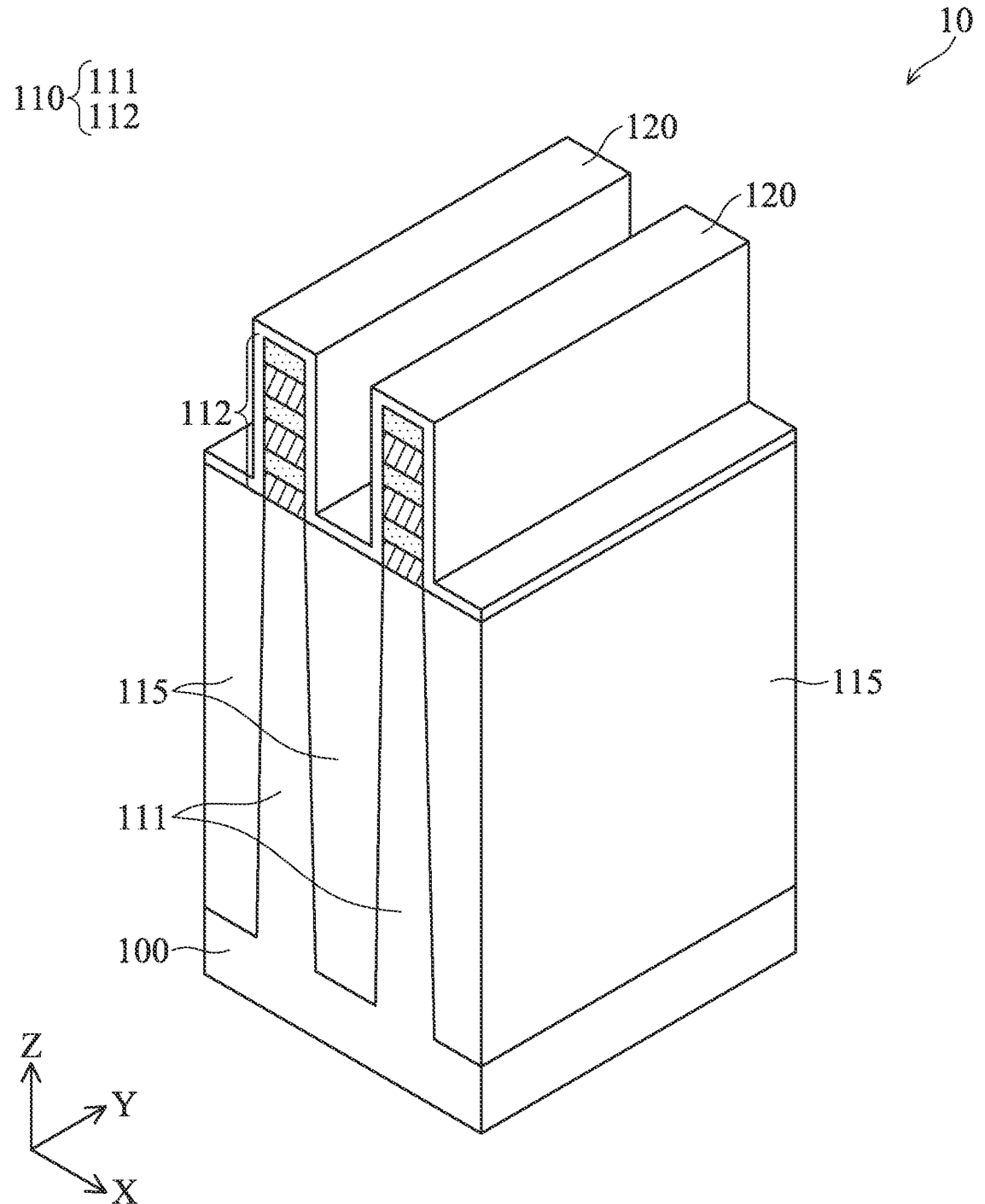

Referring to FIG. 5, a dummy dielectric layer 120 is formed on the substrate 100. In some embodiments, the dummy dielectric layer 120 conformally covers the surfaces of the nanosheet stacks 112 and the top surfaces 115t of the isolation regions 115. In some embodiments, the dummy dielectric layer 120 includes silicon oxide, silicon nitride, silicon oxynitride, or the like, and may be formed by CVD, ALD or the like. The dummy dielectric layer 120 and the isolation regions 115 may have the same or different dielectric materials.

Figure 6:
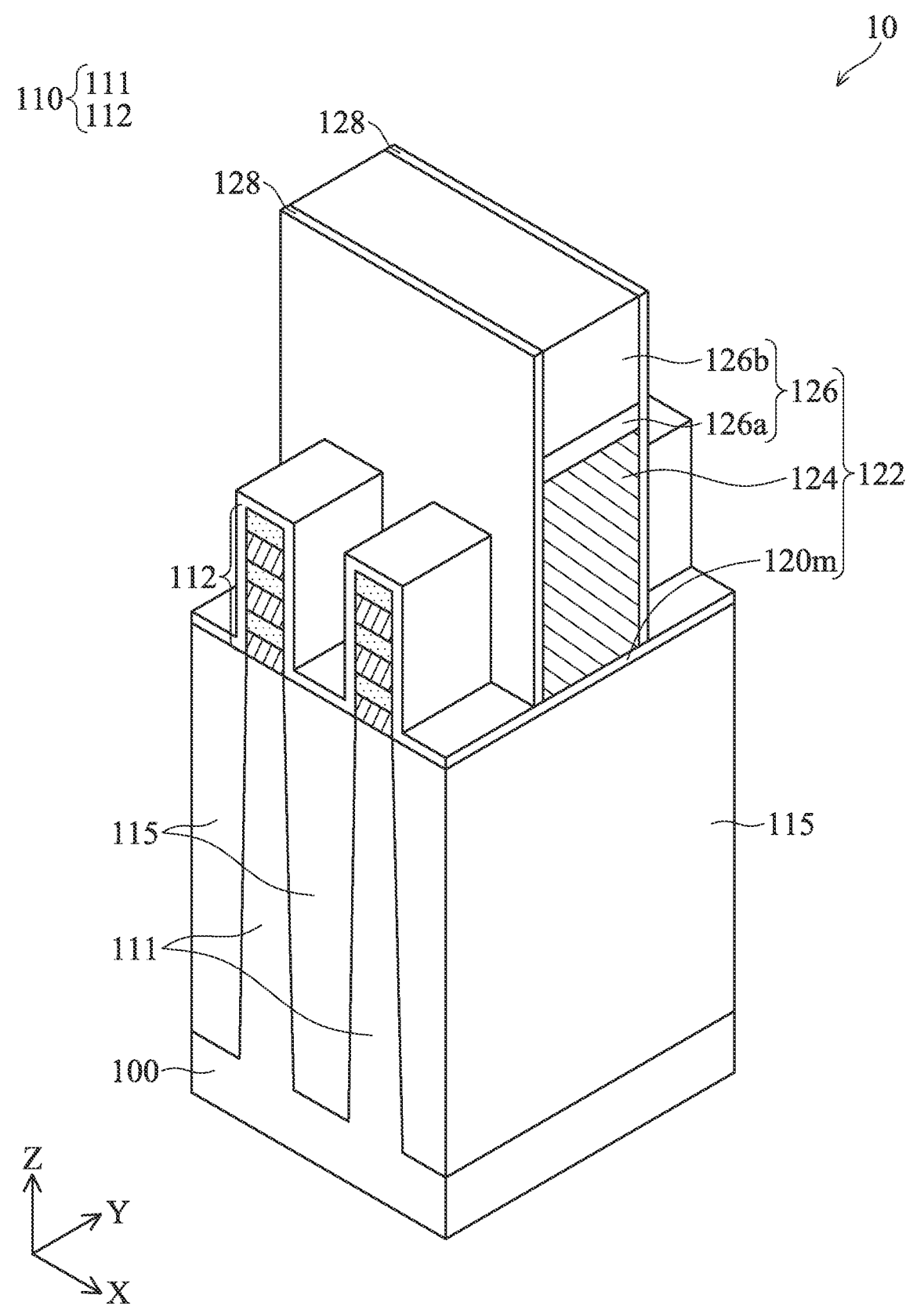

Referring to FIG. 6, a dummy gate stack 122 is formed over portions of the nanosheet stacks 112 and portion of the isolation regions 115. The dummy gate stack 122 may extend along an X-direction perpendicular to the extending direction of the nanosheet stacks 112. That is, the dummy gate stack 122 may be formed across the nanosheet stacks 112.

Specifically, the dummy gate stack 122 may include dummy gate electrode 124 and a portion of the dummy dielectric layer 120 covered by the dummy gate electrode 124. Herein, the portion of the dummy dielectric layer 120 covered by the dummy gate electrode 124 is referred to as dummy gate dielectric layer 120m. In some embodiments, the dummy gate electrode 124 includes a silicon-containing material, such as poly-silicon, amorphous silicon, or a combination thereof. The dummy gate electrode 124 may be formed by using a suitable process, such as ALD, CVD, PVD, plating, or combinations thereof. Although the dummy gate electrode 124 illustrated in FIG. 6 is a single-layered structure, the embodiments of the present disclosure are not limited thereto. In other embodiments, the dummy gate electrode 124 may be a multi-layered structure. The dummy gate stack 122 may also include hard mask layer 126 over dummy gate electrode 124. In some embodiments, the hard mask layer 126 includes a single-layered structure, a two-layered structure, a multi-layered structure. For example, as in FIG. 6, the hard mask layer 126 includes a silicon oxide layer 126a and a silicon nitride layer 126b disposed over the silicon oxide layer 126a.

Still referring to FIG. 6, gate spacers 128 are also formed on sidewalls of the dummy gate stack 122. Similar to the dummy gate stack 122, the gate spacers 128 are also formed across the nanosheet stacks 112. In some embodiments, the gate spacers 128 are formed of dielectric materials, such as silicon oxide, silicon nitride, carbonized silicon nitride (SiCN), SiCON, or a combination thereof. A thickness of the gate spacers 128 ranges from about 2 nm to about 10 nm in some embodiments. Although the gate spacers 128 illustrated in FIG. 6 is a single-layered structure, the embodiments of the present disclosure are not limited thereto. In other embodiments, the gate spacers 128 may be a multi-layered structure. For example, the spacer 128 may include a silicon oxide layer and a silicon nitride layer disposed on the silicon oxide layer. The dummy gate stack 122 and the gate spacers 128 cover middle portions of the nanosheet stacks 112, and reveal the opposite end portions not covered.

Figure 7:
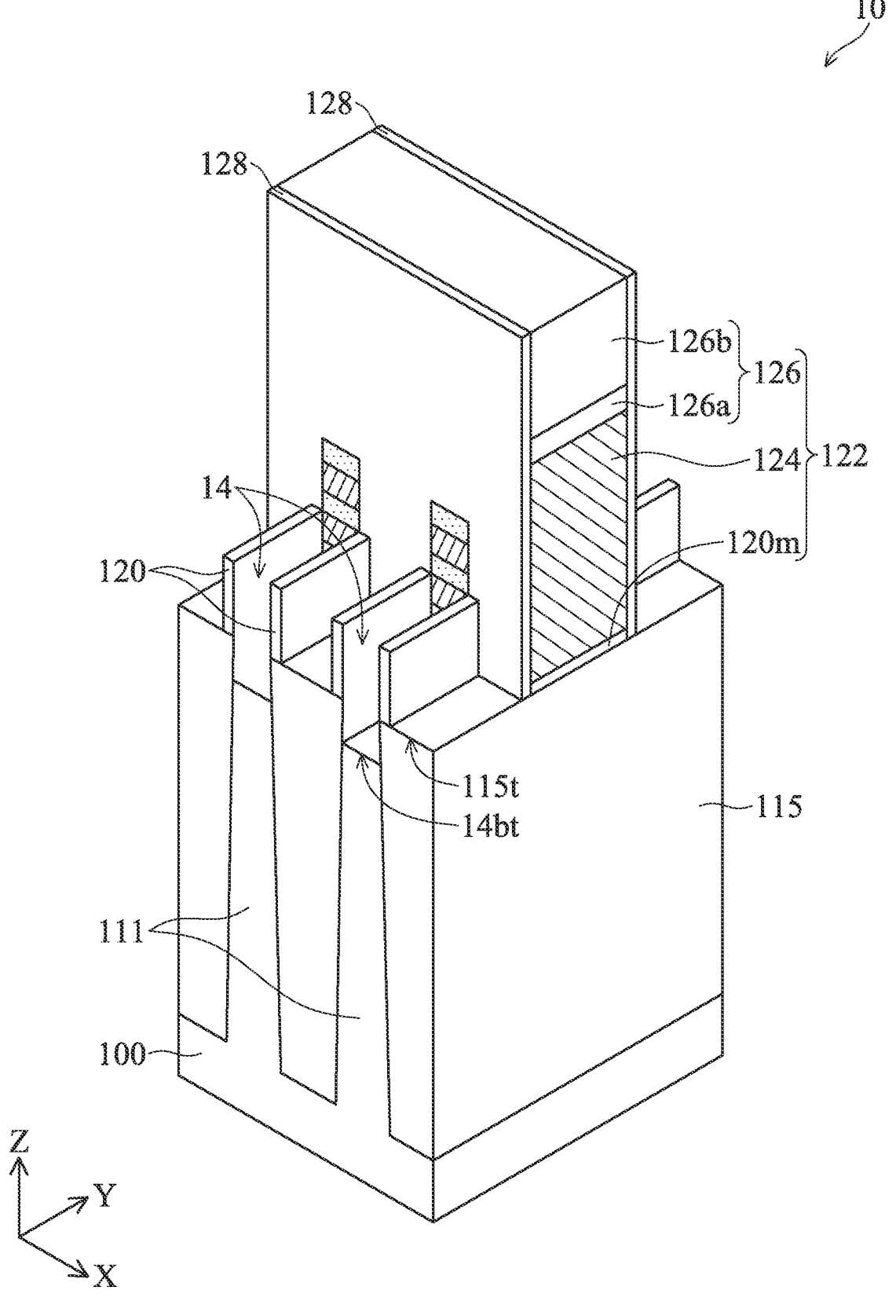

Referring to FIG. 7, the end portions of the nanosheet stacks 112 are removed and recessed to form recesses 14. Herein, the recesses 14 may be referred to as source/drain (S/D) recesses 14. In some embodiments, the end portions of the nanosheet stacks 112 may be removed by an anisotropic etching process, an isotropic etching process, or a combination thereof. In some embodiments, the S/D recesses 14 further extend into the fin bases 111 and are lower than the top surfaces 115t of the isolation regions 115. In other words, the end portions of the nanosheet stacks 112 are entirely removed and top portions of the fin bases 111 are further removed. In the case, as shown in FIG. 7, the bottom surfaces 14bt of the S/D recesses 14 are lower than the top surfaces 115t of the isolation regions 115. In some embodiments, some portions of the dummy dielectric layer 120 are removed and other portions of the dummy dielectric layer 120 may be left standing over and aligned to the edges of isolation regions 115, with the S/D recesses 14 formed therebetween. The gate spacers 128 may cover sidewalls of the dummy gate stack 122 which includes the dummy gate dielectric layer 120m, the dummy gate electrode 124, and the hard mask layer 126.

Figure 8:
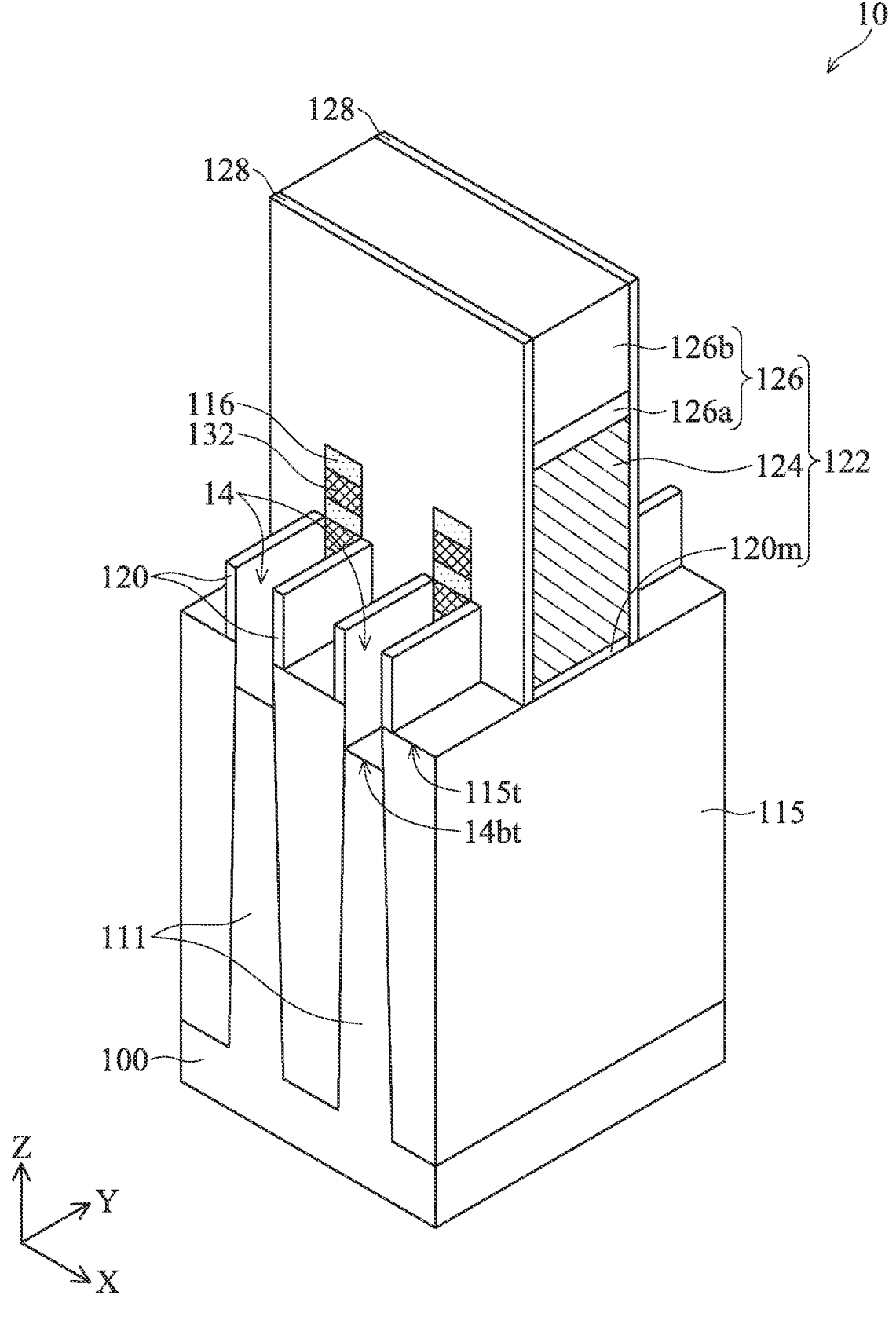

Referring to FIG. 8, after forming the S/D recesses 14, a plurality of inner spacers 132 are formed at opposite end portions of the first nanosheets 114. In some embodiments, opposite end portions of the first nanosheets 114 as exposed in the source/drain trenches 14 are selectively and partially recessed to form inner spacer recesses (not shown), while the second nanosheets 116 are substantially unetched. In an embodiment where the second nanosheets 116 consist essentially of silicon (Si) and the first nanosheets 114 consist essentially of silicon germanium (SiGe), the selective and partial recess of the first nanosheets 114 may include a SiGe oxidation process followed by a SiGe oxide removal. The SiGe oxidation process may include use of ozone ($O_3$). In some other embodiments, the selective recess may be a selective isotropic etching process (e.g., a selective dry etching process or a selective wet etching process), and the extent at which the first nanosheets 114 are recessed is controlled by duration of the etching process. The selective dry etching process may include use of one or more fluorine-based etchants, such as fluorine gas or hydrofluorocarbons. The selective wet etching process may include a hydro fluoride (HF) or NH$_4$OH etchant. After the formation of the inner spacer recesses, an inner spacer material layer is deposited over the semiconductor device 10, including in the inner spacer recesses. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess inner spacer material layer over the gate spacers 128 and sidewalls of the second nanosheets 116, thereby forming the inner spacer features 132. In some embodiments, the etch back process may be a dry etch process that includes use of an oxygen-containing gas, hydrogen, nitrogen, a fluorine-containing gas (e.g., CF$_4$, SF$_6$, CH$_2$F$_2$, CHF$_3$, and/or C$_2$F$_6$), a chlorine-containing gas (e.g., Cl$_2$, CHCl$_3$, CCl$_4$, and/or BCl$_3$), a bromine-containing gas (e.g., HBr and/or CHBR$_3$), an iodine-containing gas (e.g., CF$_3$I), other suitable gases and/or plasmas, and/or combinations thereof.

Figure 9:
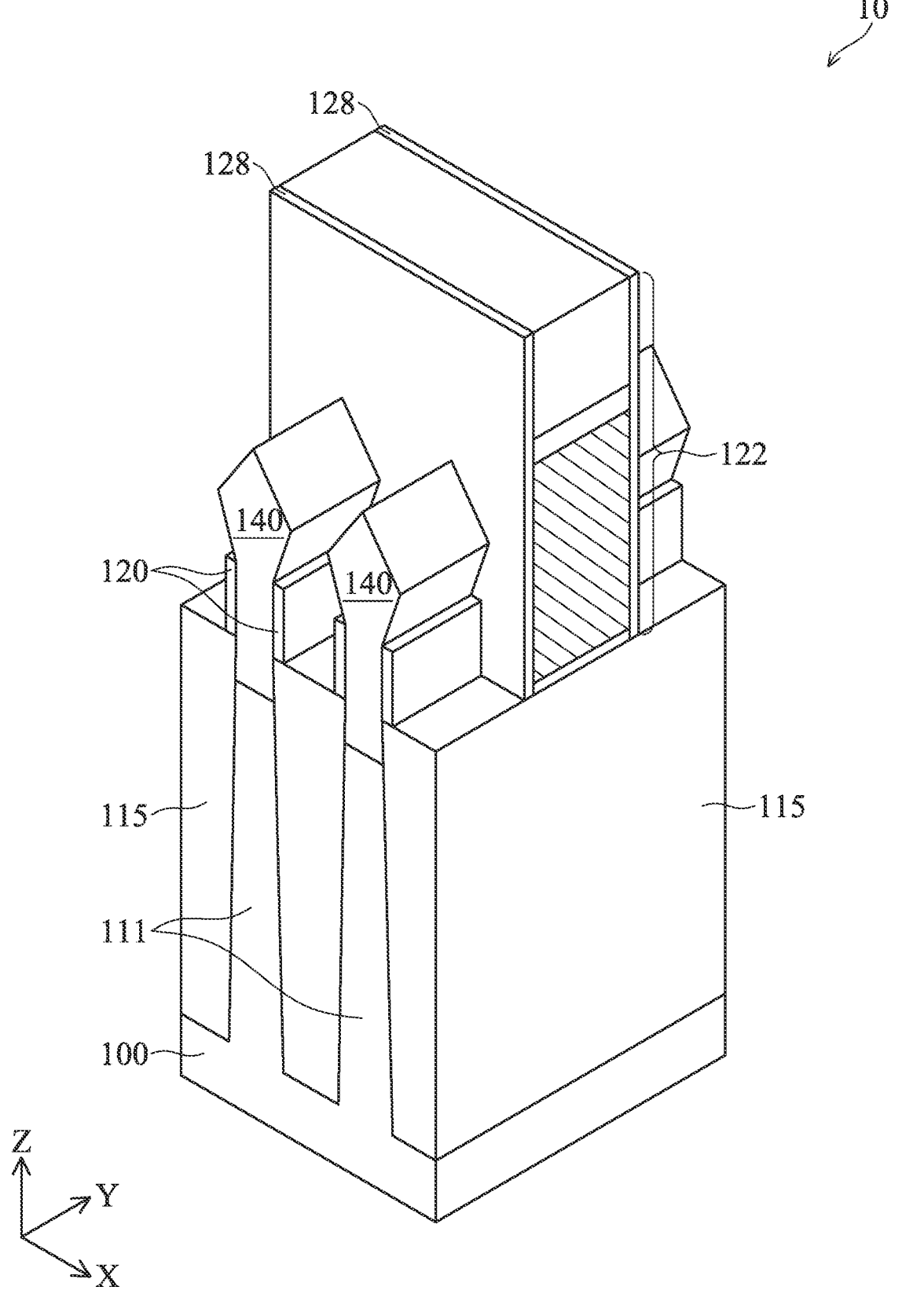

Referring to FIG. 9, a strained material 140 (or a highly doped low resistance material) are epitaxially grown from the S/D recesses 14. In some embodiments, the strained material 140 is used to strain or stress the second nanosheets 116 and the fin bases 111. Herein, the strained material 140 may be referred to as S/D regions 140. In the case, the strained material 140 includes a source disposed at one side of the dummy gate stack 122 and a drain disposed at another side of the dummy gate stack 122. The source covers an end of the fin bases 111, and the drain covers another end of the fin bases 111. The S/D regions 140 are abutted and electrically connected to the second nanosheets 116, while the S/D regions 140 are electrically isolated from the first nanosheets 114 by the inner spacers 132. In some embodiments, the S/D regions 140 extends beyond the top surface of the nanosheet stacks 112. However, the embodiments of the present disclosure are not limited thereto, in other embodiments, the top surface of the S/D regions 140 is substantially aligned with the top surface of the nanosheet stacks 112.

The S/D regions 140 include any acceptable material, such as appropriate for p-type transistors or n-type transistors. For example, the S/D regions 140 may include SiGe, SiGeB, Ge, GeSn, or the like, which is appropriate for p-type transistors. In some alternative embodiments, the S/D regions 140 may include silicon, SiC, SiCP, SiP, or the like, which is appropriate for n-type transistors. In some embodiments, the S/D regions 140 are formed by MOCVD, MBE, ALD, or the like. The S/D regions 140 may comprise one or more semiconductor material layers. For example, the S/D regions 140 may comprise a bottom semiconductor material layer, a middle semiconductor material layer, and a capping semiconductor material layer. Any number of semiconductor material layers may be used for the S/D regions 140. Each of the semiconductor material layers may be formed of different semiconductor materials and may be doped to different dopant concentrations. In embodiments in which the S/D regions 140 comprise three semiconductor material layers, the bottom semiconductor material layer may be deposited, the middle semiconductor material layer may be deposited over the bottom semiconductor material layer, and the capping semiconductor material layer may be deposited over the middle semiconductor material layer.

In some embodiments, the S/D regions 140 are doped with a conductive dopant. For example, the S/D regions 140, such as SiGe, may be epitaxial-grown with a p-type dopant for straining a p-type transistor. That is, the S/D regions 140 are doped with the p-type dopant to be the source and the drain of the p-type transistor. The p-type dopant includes boron or BF$_2$, and the S/D regions 140 may be epitaxial-grown by LPCVD process with in-situ doping. As discussed above, the S/D regions 140 may be epitaxially-grown with multiple layers differed in dopant concentrations, such as a bottom layer of SiGe:B with Ge atomic percentage from about 45% to 55% and a boron concentration of about 1×10$^{21}$/cm$^3$ to about 2×10$^{21}$/cm$^3$, a middle layer of SiGe:B with Ge atomic percentage from about 45% to 60% and a boron concentration of about 8×10$^{20}$/cm$^3$ to about 3×10$^{21}$/cm$^3$, and a capping layer of SiGe:B with Ge atomic percentage from about 25% to 45% and a boron concentration of about 1×10$^{20}$/cm$^3$ to about 8×10$^{20}$/cm$^3$. In some alternative embodiments, the S/D regions 140, such as SiC, SiP, a combination of SiC/SiP, or SiCP is epitaxial-grown with an n-type dopant for straining an n-type transistor. That is, the S/D regions 140 are doped with the n-type dopant to be the source and the drain of the n-type transistor. The n-type dopant includes arsenic and/or phosphorus, and the S/D regions 140 may be epitaxial-grown by LPCVD process with in-situ doping. In some embodiments, the S/D regions 140 are epitaxially-grown with multiple layers differed in dopant concentrations, such as a bottom layer of Si:P with a phosphorus concentration of about 1×10$^{21}$/cm$^3$ to about 2×10$^{21}$/cm$^3$, a middle layer of Si:P with a phosphorus concentration of about 1×10$^{21}$/cm$^3$ to about 4×10$^{21}$/cm$^3$, and a capping layer of Si:As with an arsenic concentration of about 1×10$^{20}$/cm$^3$ to about 1×10$^{21}$/cm$^3$.

As a result of the epitaxial-grown process used to form the S/D regions 140, the cross section of the S/D regions 140 may have a diamond or pentagonal shape. However, the embodiments of the present disclosure are not limited thereto. In other embodiments, the cross section of the S/D regions 140 also have a hexagonal shape, a pillar shape, or a bar shape. In some embodiments, as shown in FIG. 9, adjacent S/D regions 140 are separated from each other after the epitaxial-grown process is completed. Alternatively, adjacent S/D regions 140 may be merged.

Figure 10:
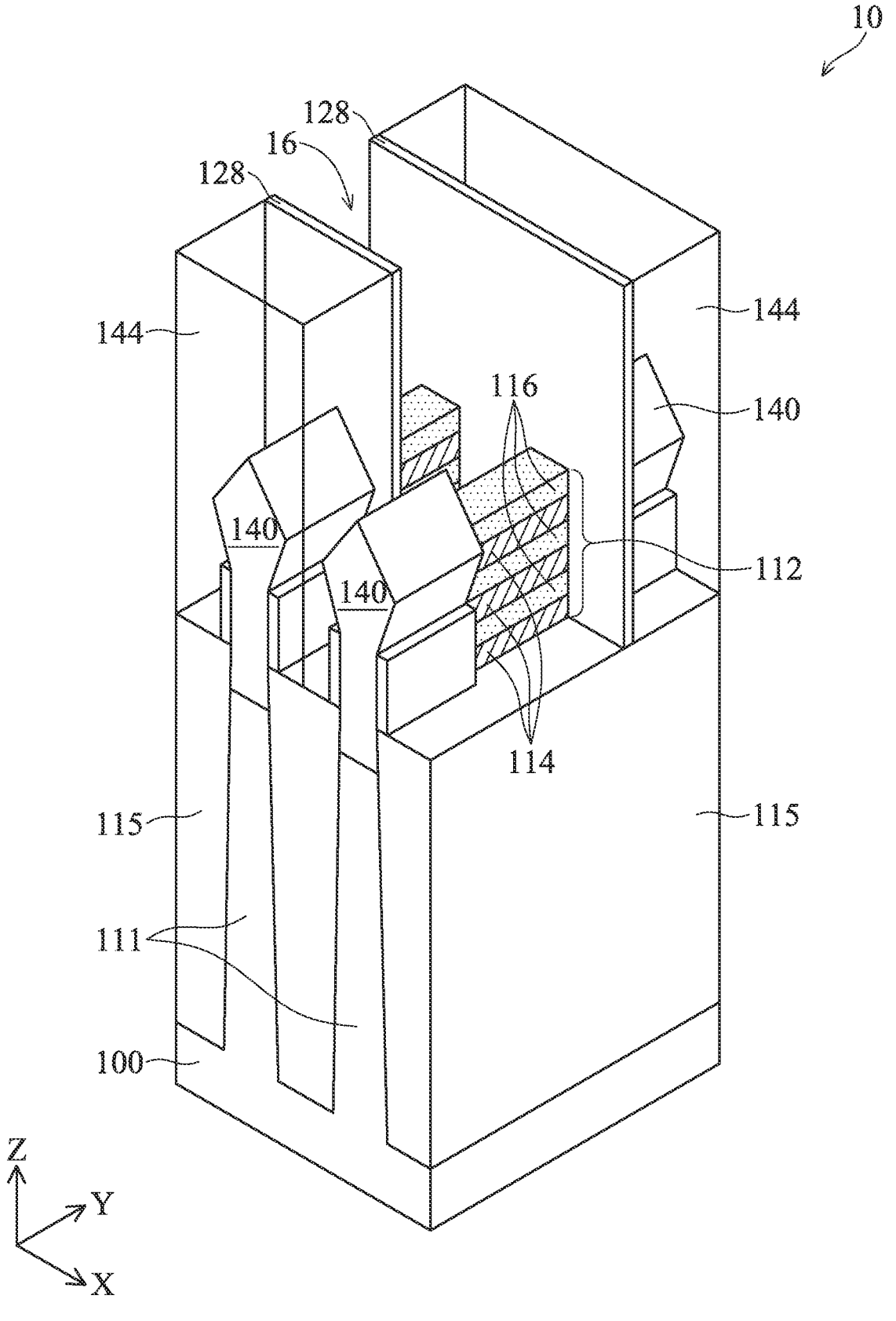

Referring to FIG. 10, an interlayer dielectric (ILD) layer 144 is formed over the semiconductor device 10. A contact etch stop layer (CESL) may also be formed between the S/D regions 140 and the ILD layer 144. For clarity, the CESL is not illustrated in FIG. 10. In addition, in order to illustrate the features behind the front portion of the ILD layer 144, some front portions of the ILD layer 144 are not shown in FIG. 10 and subsequent figures, so that the inner features may be illustrated. It is appreciated that the un-illustrated portions of the ILD layer 144 still exist.

In some embodiments, the CESL conformally covers the S/D regions 140 and the sidewalls of the outer sidewalls of the gate spacers 128. The CESL may include silicon nitride, silicon oxynitride, silicon nitride with oxygen (O) or carbon (C) elements, and/or other materials; and may be formed by CVD, PVD (physical vapor deposition), ALD, or other suitable methods.

The ILD layer 144 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the ILD layer 144 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK®
(Dow Chemical, Midland, Mich.), hydrogen silsesquioxane
(HSQ) or fluorinated silicon oxide (SiOF), and/or a combi-
nation thereof. In alternative embodiments, the ILD layer
144 include one or more dielectric materials and/or one or
more dielectric layers. In some embodiments, the ILD layer
144 is formed to a suitable thickness by FCVD, CVD,
HDPCVD, SACVD, spin-on, sputtering, or other suitable
methods. For example, an interlayer dielectric material layer
is initially formed to cover the isolation regions 115, the
dummy gate stack 122, and the gate spacers 128. Subse-
quently, a thickness of the interlayer dielectric material layer
is reduced until the dummy gate stack 122 is exposed, so as
to form the ILD layer 144. The process of reducing the
thickness of the interlayer dielectric material layer may be
achieved by a chemical mechanical polishing (CMP) pro-
cess, an etching process, or other suitable processes. In the
case, the top surface of the ILD layer 144 may be coplanar
with the top surface of the dummy gate stack 122.

Still referring to FIG. 10, the dummy gate stack 122 is
removed to form a gate trench 16. The ILD layer 144 and the
CESL may protect the S/D regions 140 during removing the
dummy gate stack 122. The dummy gate stack 122 may be
removed by using plasma dry etching and/or wet etching.
When the dummy gate electrode is polysilicon and the ILD
layer 144 is silicon oxide, a wet etchant such as a TMAH
solution may be used to selectively remove the dummy gate
electrode. The dummy gate dielectric layer is thereafter
removed by using another plasma dry etching and/or wet
etching.

Figure 11:
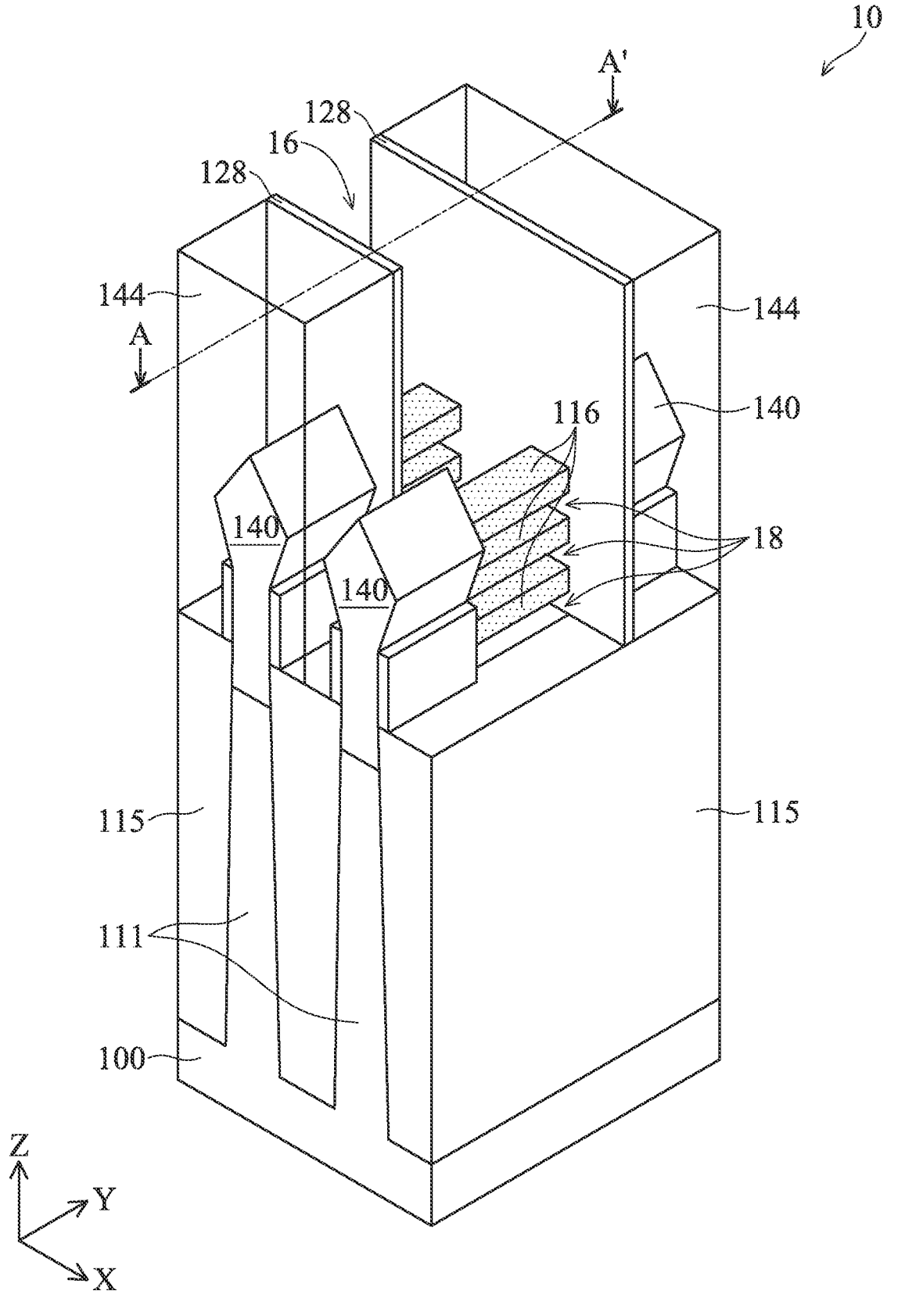
Figure 12:
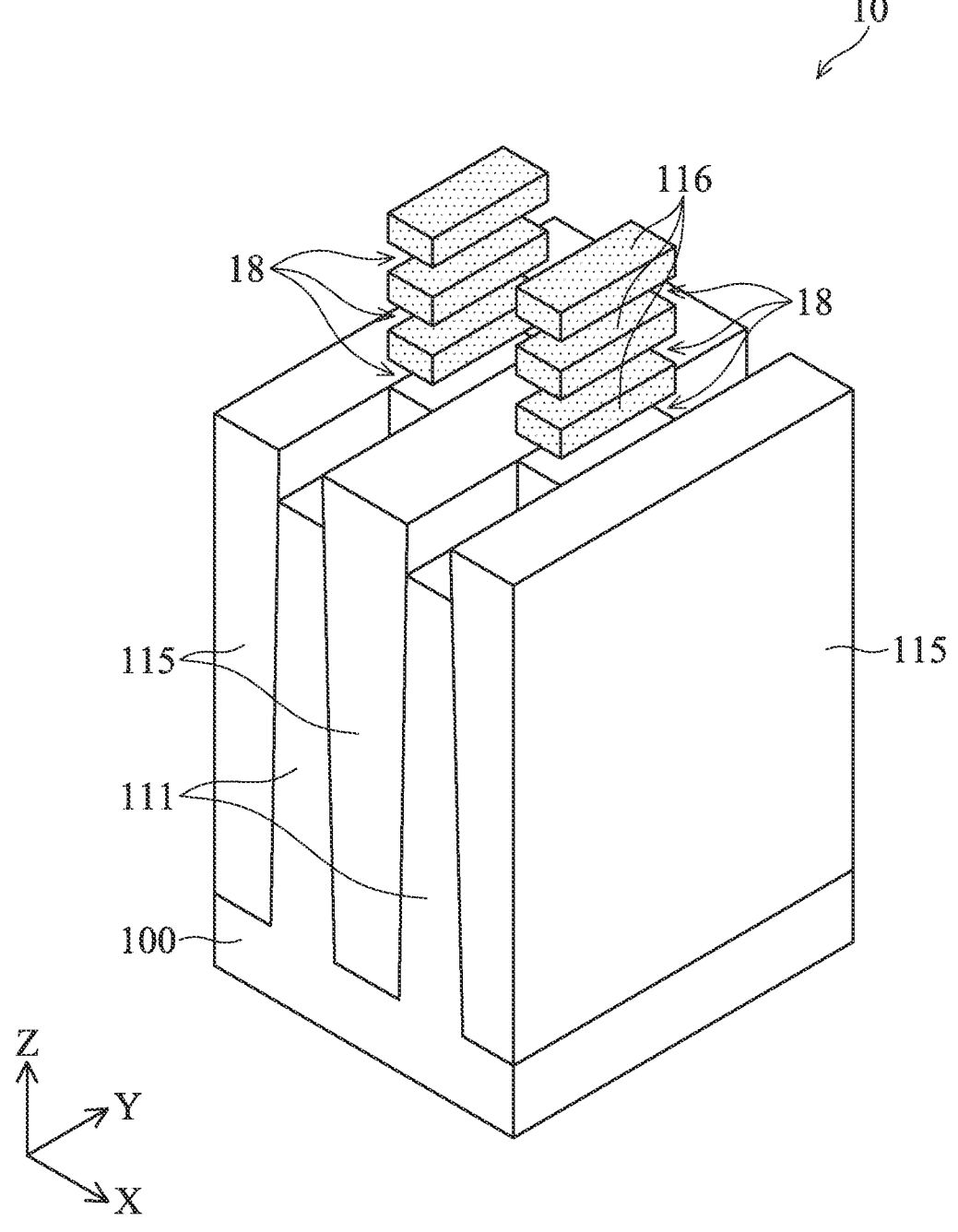

Referring to FIG. 11, an etching process is performed to
remove the first nanosheets 114. In the case, the first
nanosheets 114 may be completely removed to form a
plurality of gaps 18 between the second nanosheets 116, also
as shown in FIG. 12. FIG. 12 illustrates a clearer view of the
portions of stacked nanosheets 116. The ILD 144, the S/D
regions 140, and the gate spacers 128 as shown in FIG. 11
are not shown in FIG. 12, although these features still exist.
Accordingly, the second nanosheets 116 are separated from
each other by the gaps 18. In addition, the bottommost
second nanosheet 116 may also be separated from the fin
bases 111 by the gaps 18. As a result, the second nanosheets
116 are suspended. A height of the gaps 18 ranges from
about 5 nm to about 20 nm in some embodiments. In the
present embodiment, the second nanosheets 116 include
silicon, and the first nanosheets 114 include silicon germa-
nium. The first nanosheets 114 may be selectively removed
by oxidizing the first nanosheets 114 using a suitable oxi-
dizer, such as ozone. Thereafter, the oxidized first
nanosheets 114 may be selectively removed from the gate
trench 16. In some embodiments, the etching process
includes a dry etching process to selectively remove the first
nanosheets 114, for example, by applying an HCl gas at a
temperature of about 20° C. to about 300° C., or applying a
gas mixture of $CF_4$, $SF_6$, and $CHF_3$. The opposite ends of the
suspended second nanosheets 116 are connected to S/D
regions 140. The suspended second nanosheet 116 may be
referred to as channel members 116 hereinafter. The etching
process may be referred to as channel member releasing
process.

Figure 13:
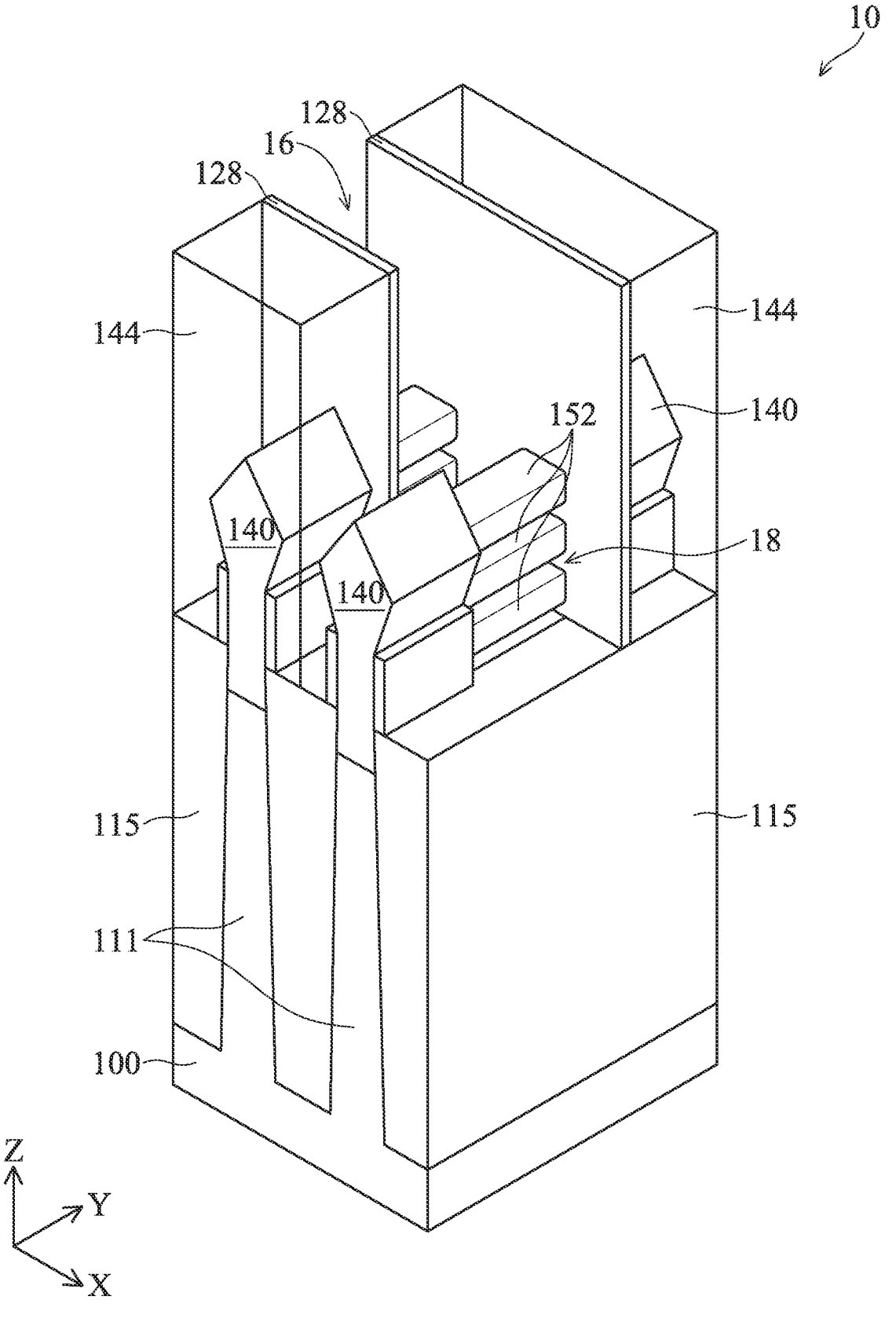
Figure 14:
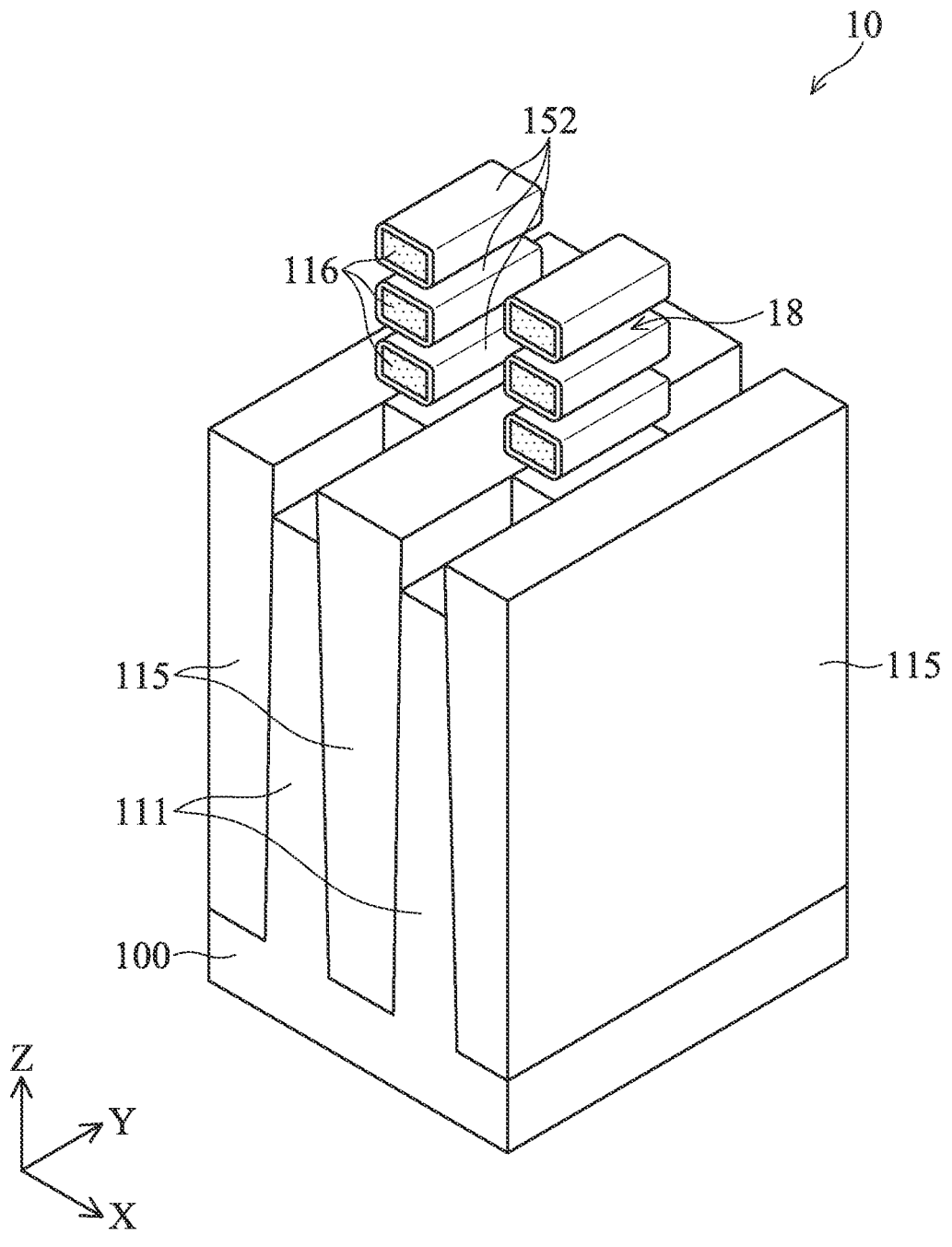

Referring to FIGS. 13 and FIG. 14, a gate dielectric layer
152 is formed in the gate trench 16 and the gaps 18. FIG. 14
illustrates a clearer view of the gate dielectric layer 152
wrapping the channel members 116. In some embodiments,
the gate dielectric layer 152 includes one or more layers of
a dielectric material, such as silicon oxide, silicon nitride, or
high-k dielectric material, other suitable dielectric material, and/or combinations thereof. Examples of high-k dielectric
material include $HfO_2$, HfSiO, HfSiON, HfTaO, HfTiO,
HfZrO, zirconium oxide, lanthanum oxide, aluminum oxide,
titanium oxide, hafnium dioxide-alumina ($HfO_2$—$Al_2O_3$)
alloy, other suitable high-k dielectric materials, and/or com-
binations thereof. In some embodiments, the gate dielectric
layer 152 includes an interfacial layer (not shown) formed
between the channel members 116 and the high-k dielectric
material. The gate dielectric layer 152 may be formed by
CVD, ALD or any suitable method. In one embodiment, the
gate dielectric layer 152 is formed by using a highly con-
formal deposition process, such as ALD in order to ensure
the formation of a gate dielectric layer having a uniform
thickness around each channel members 116. A thickness of
the gate dielectric layer 152 ranges from about 0.5 nm to
about 3 nm in some embodiments.

Figure 15:
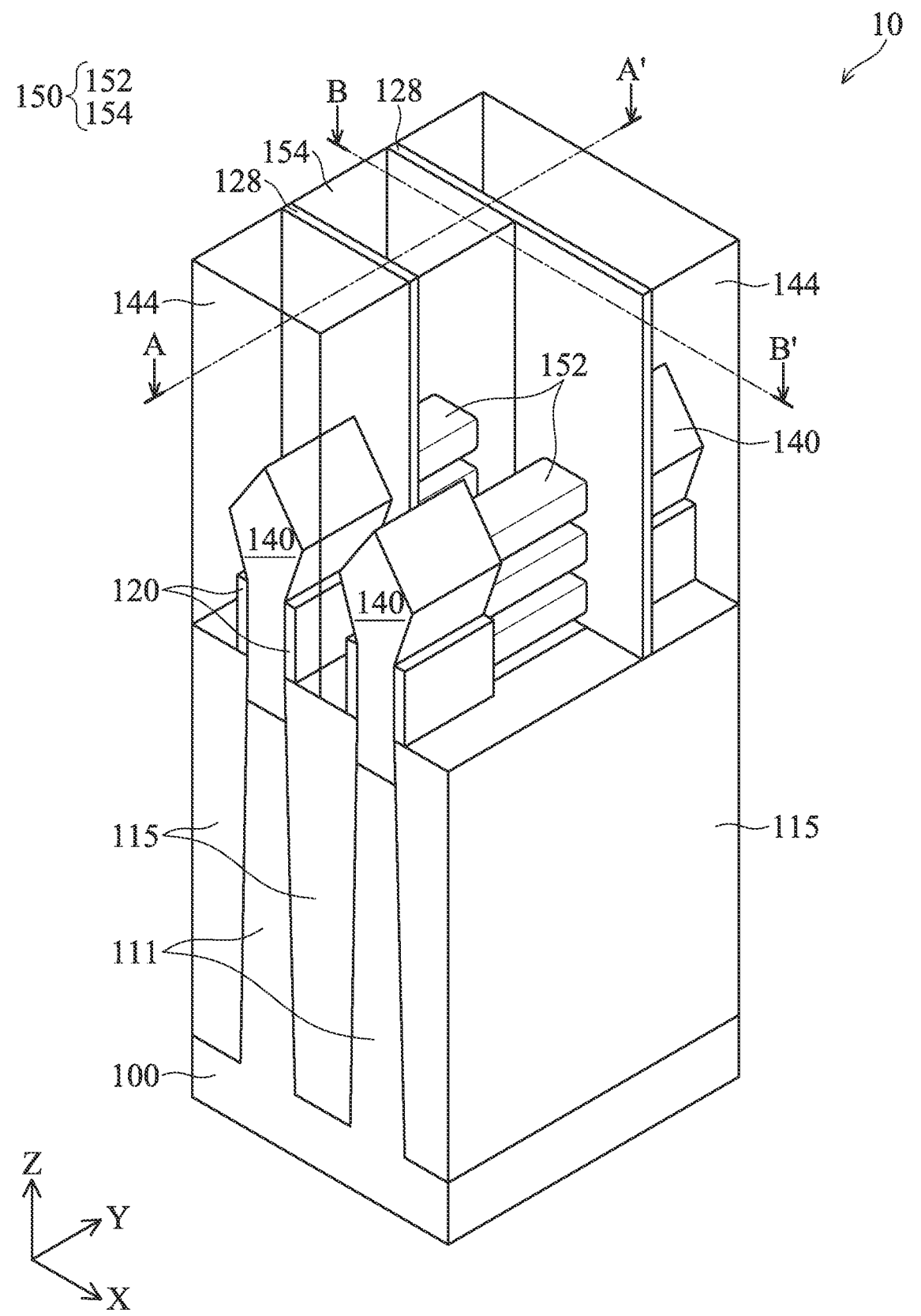

Referring to FIG. 15, a gate electrode 154 is formed on the
gate dielectric layer 152 and then planarized by using, for
example, a CMP process, until the top surface of the ILD
layer 144 are revealed. In the case, the gate electrode 154
and the gate dielectric layer 152 constitute a gate stack 150.
The gate electrode 154 may include various conductive
materials, such as polysilicon, aluminum, copper, titanium,
tantalum, tungsten, cobalt, molybdenum, tantalum nitride,
nickel silicide, cobalt silicide, TiN, WN, TiAl, TiAlN, TaCN,
TaC, TaSiN, metal alloys, other suitable materials, and/or
combinations thereof. The gate electrode 154 may include
one or more layers of conductive materials, such as a work
function metal (WFM) layer (e.g., WFM layer 160 in FIG.
16) and a metal fill layer (e.g., metal fill layer 176 in FIG.
20), and/or other suitable layer.

In some embodiments, the WFM layer may be deposited
to surround each channel member 116. Voids may be formed
in the WFM layer. The voids are generally exposed to the
outer surface of the WFM layer due to the limited gap filling
capability of the conductive materials used in the WFM
layer. To prevent impurities from being introduced into the
voids in subsequent deposition processes, the WFM layer
may be recessed and a blocking layer may be deposited to
seal the WFM layer and the voids from the top. The blocking
layer blocks impurities from entering the voids, which
otherwise may cause WFM resistance shifting and transistor
Vt shifting. A metal fill layer may be subsequently deposited
on the blocking layer to complete the gate electrode 154.

Figure 21:
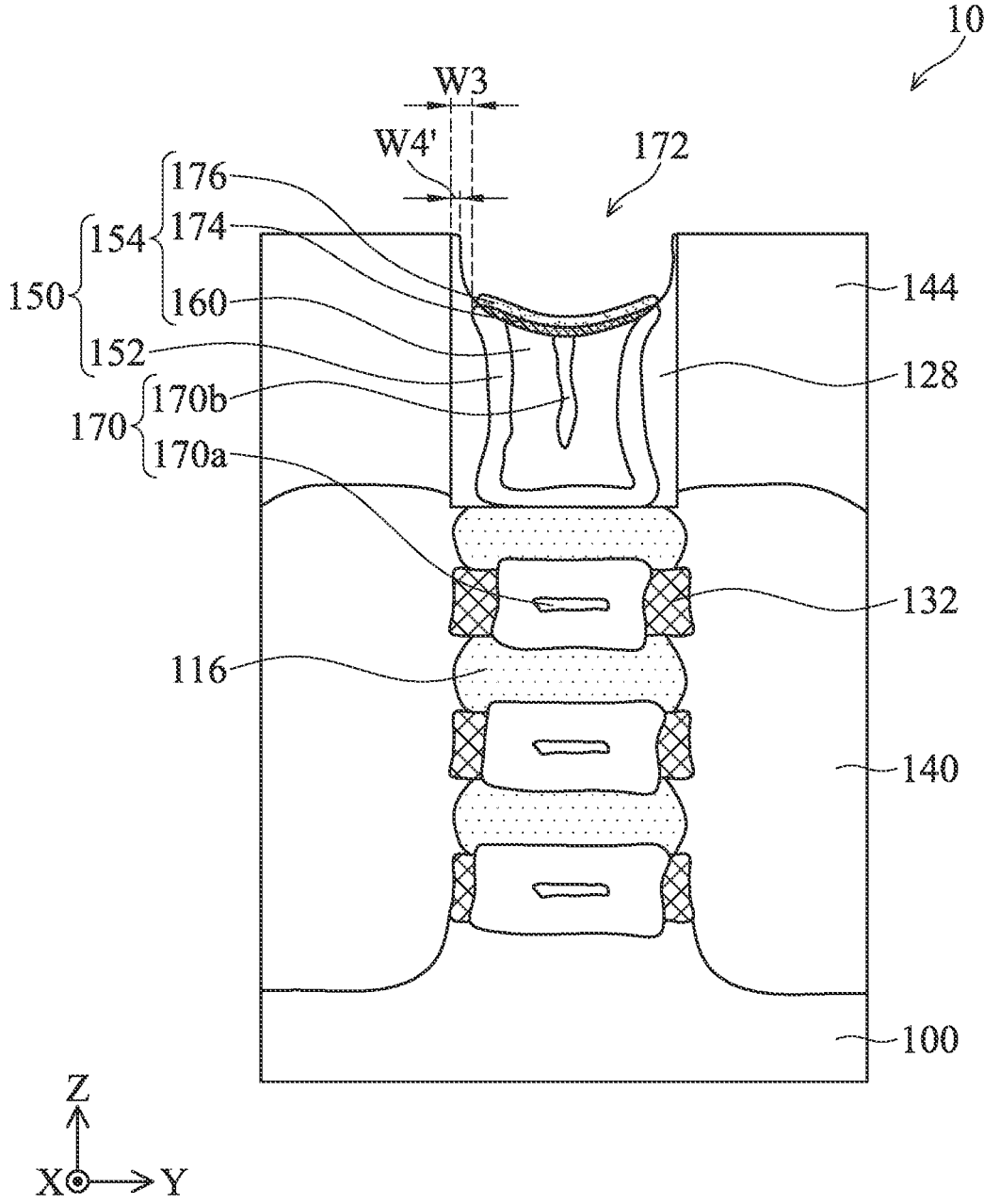
Figure 22:
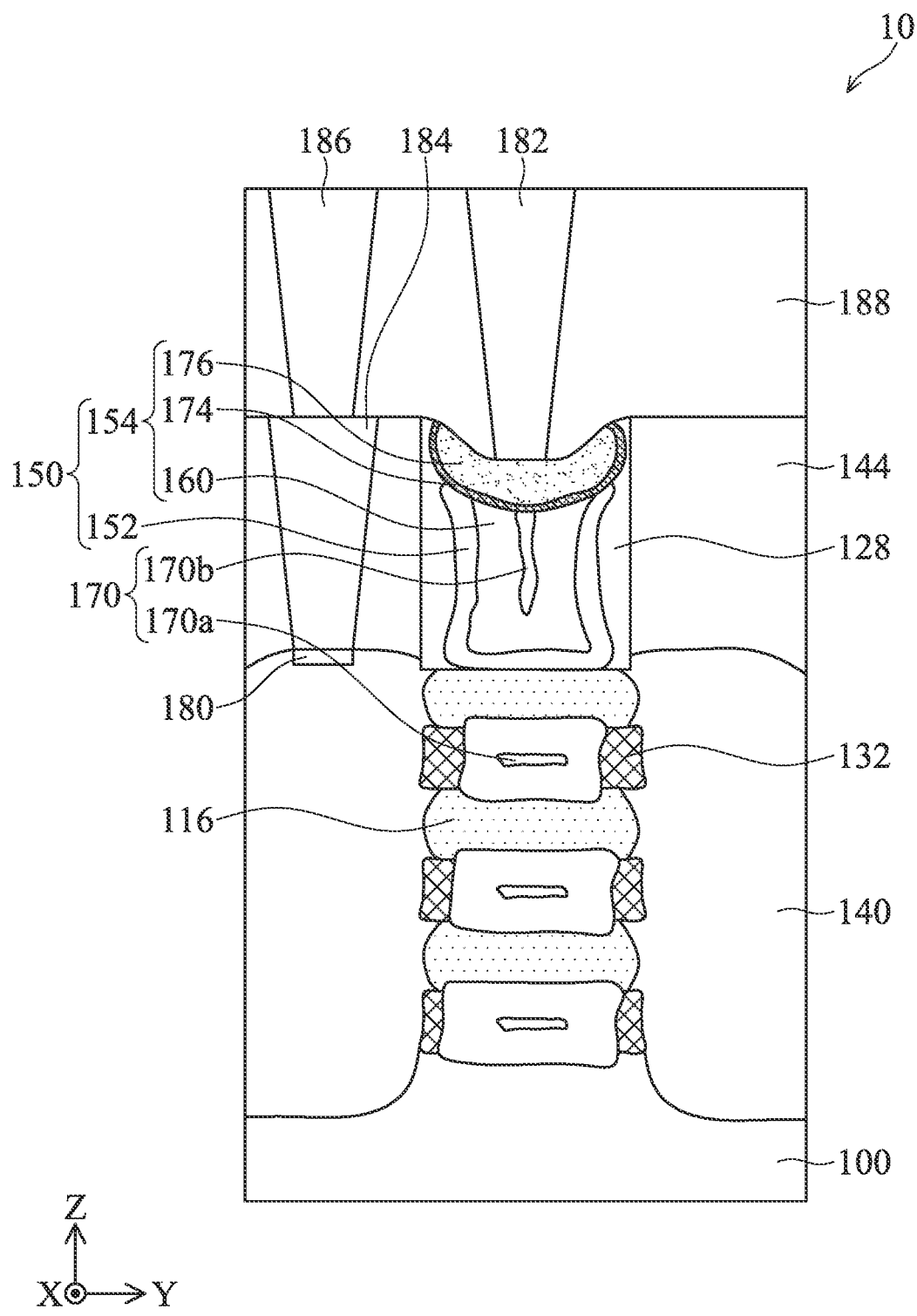
Figure 23:
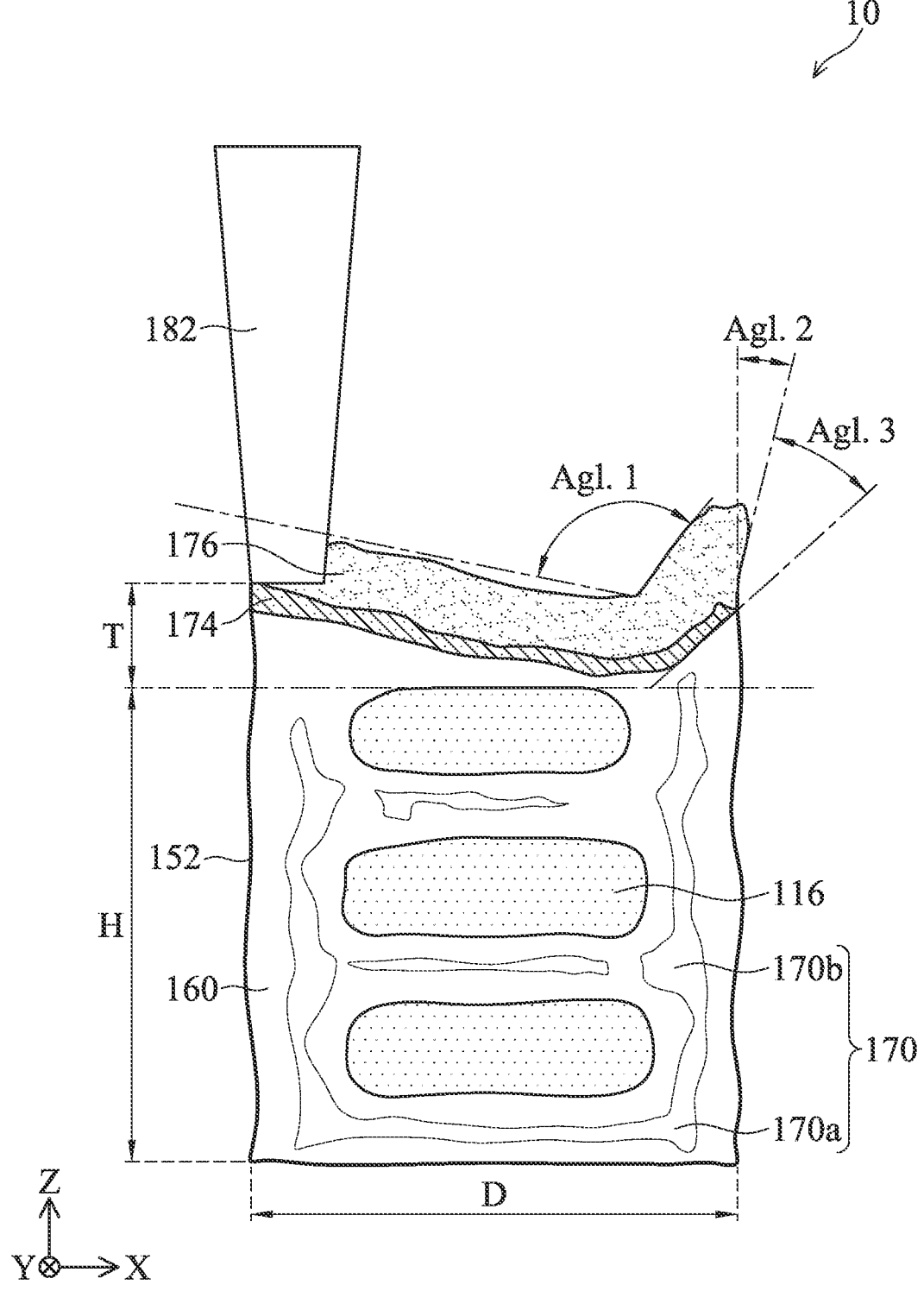

For clarity, the steps of forming the gate electrode 154 are
shown in FIGS. 16-22. FIGS. 16, 17a, 17b, 17c, 18, 19, 20,
21, and 22 correspond to fragmentary cross-sectional views
of the semiconductor device 10 in FIG. 15 taken along the
line A-A'. FIG. 23 corresponds to a fragmentary cross-
sectional view of the semiconductor device 10 in FIG. 15
taken along the line B-B'.

Figure 16:
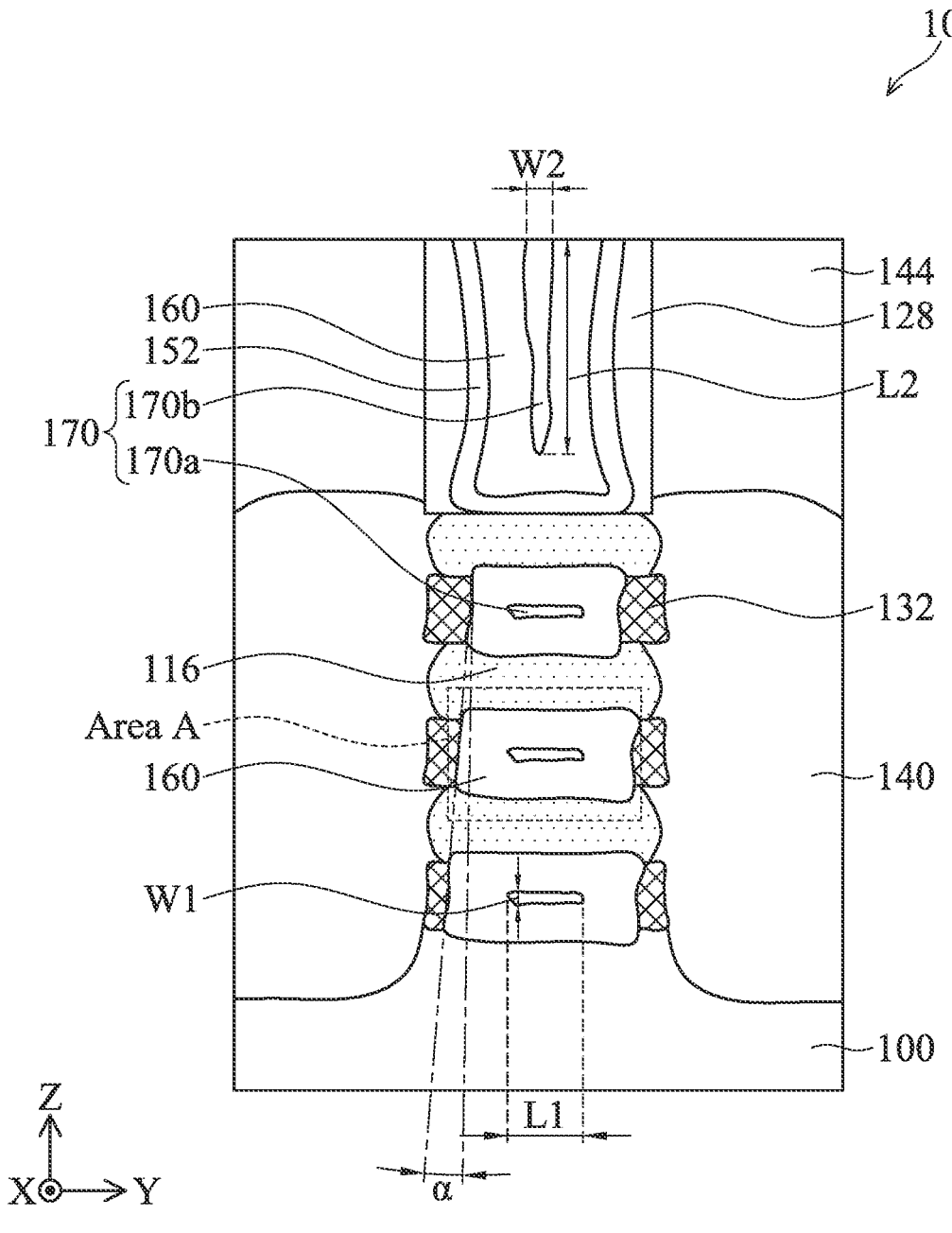
FIGS. 16, 17a, 17b, 17c, 18, 19, 20, 21, 22, and 23 illustrate cross-sectional views of a semiconductor structure during a fabrication process, according to some embodiments of the present disclosure.

Referring to FIG. 16, the WFM layer 160 fills the gate
trench 16 between the opposing sidewalls of the gate spacers
128 and surrounds each channel member 116. The WFM
layer 160 sets a selected work function to enhance the device
performance for the n-type transistor or the p-type transistor.
The WFM layer 160 is made of a conductive material, such
as a single layer of TiN, TaN, TaAlC, TiC, TaC, Co, Al, TiAl,
HfTi, TiSi, TaSi or TiAlC, or a multilayer of two or more of
these materials. For the n-type transistor, one or more of
TaN, TaAlC, TiN, TiC, Co, TiAl, HfTi, TiSi and TaSi may
be used as the WFM, and for the p-type transistor, one or
more of TiAlC, Al, TiAl, TaN, TaAlC, TiN, TiC and Co may
be used as the WFM. The WFM layer 160 may be formed
by ALD, PVD, CVD, e-beam evaporation, or other suitable
process. Further, the WFM layer 160 may be formed separately for the n-type transistor and the p-type transistor which may use different metal layers.

During the deposition of the WFM into the gate trench 16 and the gaps 18, voids 170 are formed due to the limited gap filling capability of the conductive materials used in the WFM layer 160. Particularly when aspect ratio of the gate trench 16 becomes high with transistor dimensions being continually scaled down to sub-10 nm technology nodes, it becomes difficult for the WFM to completely fill up the gaps 18. The voids 170 generally have a high aspect ratio (e.g., a ratio of length over width larger than 5) and may also be referred to as seams 170. The voids 170 are in an open state. That is, the voids 170 are generally open to the outer surface of the WFM layer 160. The voids 170 positioned in the gaps 18 (under the topmost channel member 116) generally extend horizontally along the lengthwise direction of the channel members 116 (Y-direction), which is denoted as voids 170a. In some embodiments, the voids 170a has a width W1 ranging from about 1 nm to about 10 nm and a length L1 ranging from about 5 nm to about 50 nm. The voids 170 above the topmost channel member 116 generally extend vertically (Z-direction) between the opposing sidewalls of the gate spacers 128, which is denoted as voids 170b. In some embodiments, the voids 170b has a width W2 ranging from about 1 nm to about 5 nm and a length L2 larger than about 5 nm. Further, the length L1 of the voids 170a under the bottommost channel member 160 may be larger than other voids 170a thereabove. This is due to a larger length of the channel member 160 at the bottom. As illustrated in FIG. 16, a dotted line connecting end portions of the channel members 160 has an angle (denoted as α) with respect to a vertical direction that ranges from about 0 to 60 degrees.

Although FIG. 16 only shows one transistor in the semiconductor device 10, the semiconductor device 10 may include various transistors having different stacking conditions of the gate dielectric layer 152 and the WFM layers 160 to fit different performance needs of the transistors, such as achieving different threshold voltages. The different stacking conditions of the gate dielectric layer 152 and the WFM layers 160 may cause shapes and volumes of the voids 170a in different regions vary. For example, FIGS. 17a, 17b, and 17c illustrate enlarged views of an area A shown in dashed box in FIG. 16 in three different regions of the semiconductor device 10, respectively, to further illustrate details of voids 170a stacked between two adjacent channel members 116 in various transistors, in accordance with some embodiments.

Figures 17A, 17B, 17C:
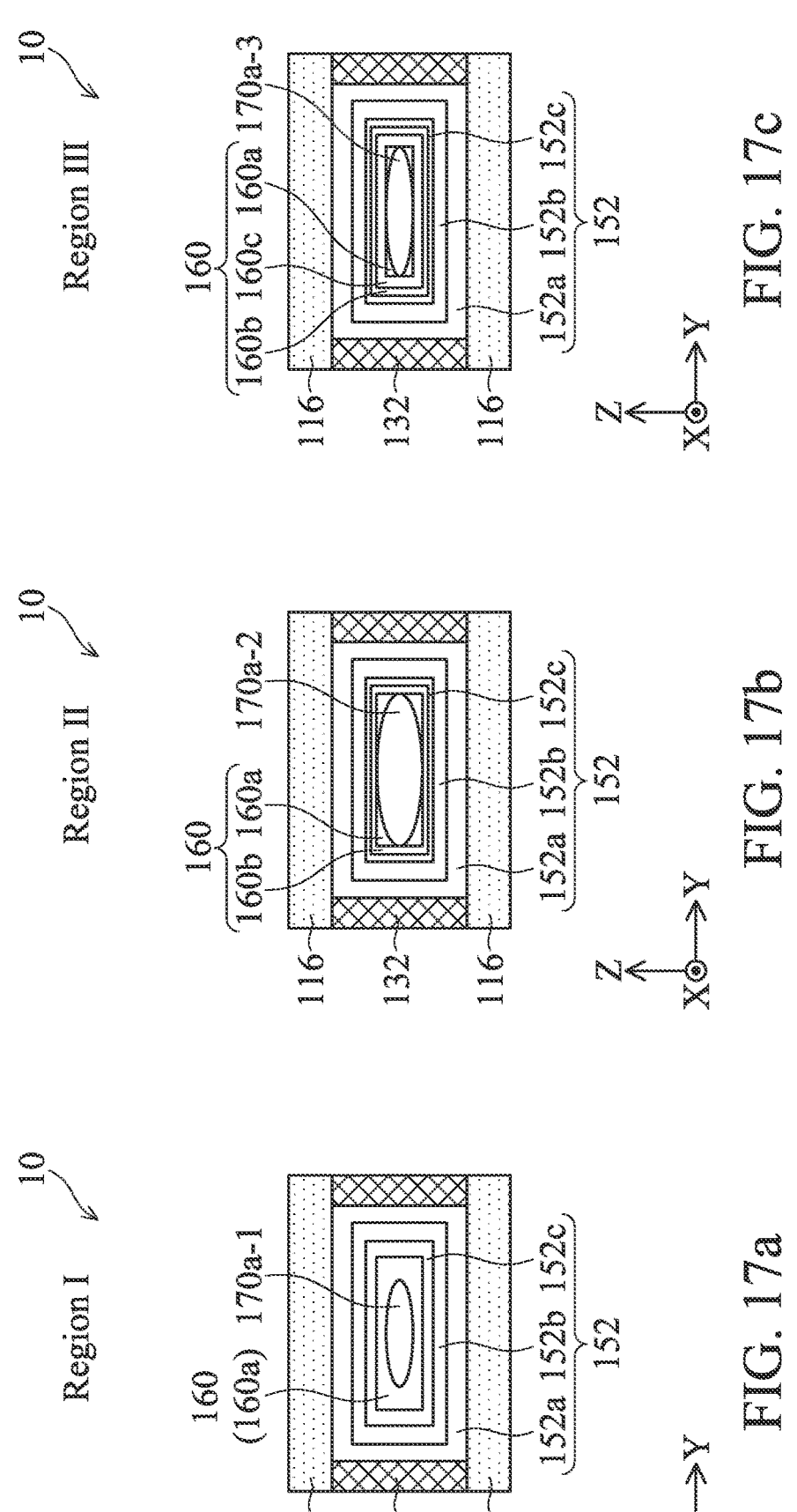

Referring to FIGS. 17a, 17b, and 17c collectively, the semiconductor device 10 includes region I, region II, and region III, in accordance with some embodiments. These regions, such as a logic region, a memory region, a peripheral region, or a combination thereof, are used for forming different active devices. The region I can be used for forming n-type transistors, such as n-type GAA transistors of a first threshold Vn. The region II can be used for forming p-type transistors, such as p-type GAA transistors of a second threshold Vp1. The region III can be used for forming p-type transistors, such as p-type GAA transistors of a third threshold Vp2. The regions I-III may be adjacent. Alternatively, each region may be separated from one another, and any number of device features (e.g., other regions, other active devices, isolation structures, etc.) may be disposed between the regions I, II, and III. In some embodiments, Vn may be a standard n-type voltage, Vp1 may be a standard p-type voltage, and Vp2 may be a low p-type voltage, such that Vn>0>Vp2>Vp1.

In each of the regions I, II, and III, the gate dielectric layer 152 may include multiple high-k dielectric material layers, such as high-k dielectric material layers 152a, 152b, and 152c in the illustrated embodiment. Each of the high-k dielectric material layers 152a, 152b, and 152c may include high-k dielectric material compositions different from one another. Examples of high-k dielectric materials include $HfO_2$, HfSiO, HfSiON, HfTaO, HfTiO, HfZrO, zirconium oxide, lanthanum oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 152 includes an interfacial layer (not shown) formed between the channel members 116 and the high-k dielectric material layer 152a. In some embodiments, the high-k dielectric material layers 152a, 152b, and 152c may have the same or different thicknesses in different regions to suit various device performance needs. For example, the high-k dielectric material layer 152a may have the same thickness in all three regions I, II, and III; the high-k dielectric material layer 152b may have the same thickness in all three regions I, II, and III; the high-k dielectric material layer 152c in the region I may be thicker than in the regions II and III.

In the region I for forming n-type transistors, the WFM layer 160 includes an n-type WFM 160a. The n-type WFM 160a may be a single layer of TaN, TaAlC, TiN, TiC, Co, TiAl, HfTi, TiSi or TaSi, or a multilayer of two or more of these materials. The n-type WFM 160a is in contact with the high-k dielectric material layer 152c. The WFM 160a does not fill up the gaps 18 between adjacent channel members 116, leaving a void 170a-1 therebetween. The void 170a-1 extends horizontally along the lengthwise direction of the channel members 116 (Y-direction).

In the region II for forming p-type transistors, the WFM layer 160 includes a first p-type WFM 160b and the n-type WFM 160a disposed on the first p-type WFM 160b. The first p-type WFM 160b may be a single layer of TiAlC, Al, TiAl, TaN, TaAlC, TiN, TiC or Co, or a multilayer of two or more of these materials. The first p-type WFM 160b is in contact with the high-k dielectric material layer 152c. The first p-type WFM 160b and n-type WFM 160a do not fill up the gaps 18 between adjacent channel members 116, leaving a void 170a-2 therebetween. The void 170a-2 extends horizontally along the lengthwise direction of the channel members 116 (Y-direction).

In the region III for forming p-type devices, the WFM layer 160 includes the first p-type WFM 160b, a second p-type WFM 160c disposed on the first p-type WFM 160b, and the n-type WFM 160a disposed on the second p-type WFM 160c. Each of the first p-type WFM 160b and the second p-type WFM 160c may be a single layer of TiAlC, Al, TiAl, TaN, TaAlC, TiN, TiC or Co, or a multilayer of two or more of these materials, but with different material compositions. The first p-type WFM 160b is in contact with the high-k dielectric material layer 152c. The first p-type WFM 160b, the second p-type WFM 160c, and n-type WFM 160a do not fill up the gaps 18 between adjacent channel members 116, leaving a void 170a-3 therebetween. The void 170a-3 extends horizontally along the lengthwise direction of the channel members 116 (Y-direction).

Due to the different stacking conditions of the high-k dielectric layers and the WFMs in the regions I, II, and III, shapes and volumes of the voids 170a are also different in the regions I, II, and III. For example, the void 170a-2 in the region II may have the largest volume due to the thinner high-k dielectric layer 152c and the lack of the second p-type WFM 160c. As a comparison, the void 170a-1 in the region I may have the smallest volume due to the thickest high-k dielectric layer 152c. The void 170a-3 in the region III may have a volume in the middle among these three. The relatively larger volume of the voids 170a-2 and 170a-3 cause the discontinuity of the n-type WFM 160a in the regions II and III, such that the n-type WFM 160a is discrete and accumulates at corners of the gaps 18 between the adjacent channel members 116 but not in a continuous form. A portion of the first p-type WFM 160b is also exposed in the void 170a-2 in the region II, and a portion of the second p-type WFM 160c is also exposed in the void 170a-3 in the region III. As a comparison, the n-type WFM 160a in the region I is continuous. One reason of the discrete n-type WFM 160a in the regions II and III is that as the scale of semiconductor devices continues to shrink, the space between two adjacent channel members 116 (the dimension of the gap 18 in the Z direction) becomes smaller and smaller. The space may not provide enough room to accommodate one or two extra WFM layers in continuous form. Also, the void 170a-3 in the region III may have the largest aspect ratio (defined as L1/W1 in FIG. 16) due to the extra second p-type WFM 160c. In the illustrated embodiment, the void 170a-3 has substantially same length in the Y-direction as the void 170a-2 but smaller width in the Z-direction than the void 170a-2, and substantially same width as the void 170a-1 but larger length than the void 170a-1.

Figure 18:
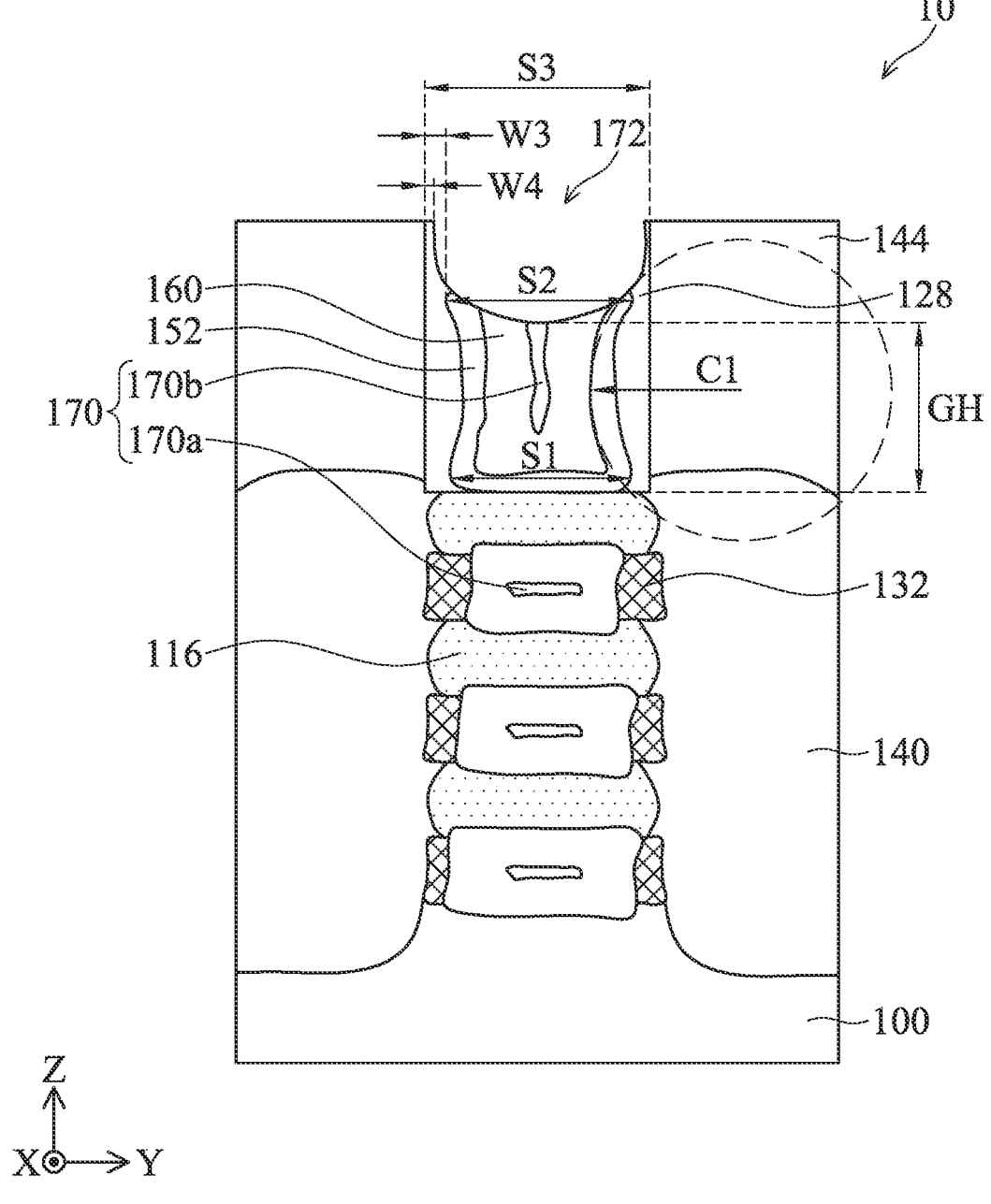

Referring to FIG. 18, the WFM layer 160 and the gate dielectric layer 152 are etched back below the upper surface of the gate spacers 128 to form a recess 172. In some embodiments, the WFM layer 160 and the gate dielectric layer 152 are etched back by a dry and/or a wet etching process. The recessed top surface of the WFM layer 160 may have a concave (e.g., dishing) profile. The remaining gate height (denoted as GH, measured from a bottom of the concave shape to the topmost channel member 116) is in a range from about 20 nm to about 40 nm in some embodiments. After the etch back process, the spacing at the bottom of the gate dielectric layer 152 (denoted as S1) is larger than a spacing at the top of the gate dielectric layer 152 (denoted as S2). The spacing between two outer sidewalls of the gate spacers 128 (denoted as S3) ranges from about 10 nm to about 30 nm in some embodiments. The interface between the gate dielectric layer 152 and the gate spacers 128 may have a necking profile, such as a curvature shape that can be approximate by a segment of a circle with a radius C1 in some embodiments. The radius C1 ranges from about 10 nm to about 20 nm in some examples. The etching process selectively removes the WFM layer 160 and the gate dielectric layer 152 with respect to the ILD layer 144, such that the ILD layer 144 is not etched or not substantially etched. The etching process may partially remove a top portion of the gate spacers 128 that extends above the recessed WFM layer 160, such that the top portion of the gate spacers 128 has a taper sidewall facing the recess 172. Closer to the top surface of the gate spacers 128, the thickness of the gate spacers 128 becomes smaller. In some embodiments, a thickness W4 of the topmost portion of the gate spacers 128 is smaller than a thickness W3 of a middle portion of the gate spacers 128 that is unetched for about 2 nm to about 5 nm. This is due to a longer duration of exposure to etchants for the dielectric material closer to the top surface of the gate spacers 128.

Figure 19:
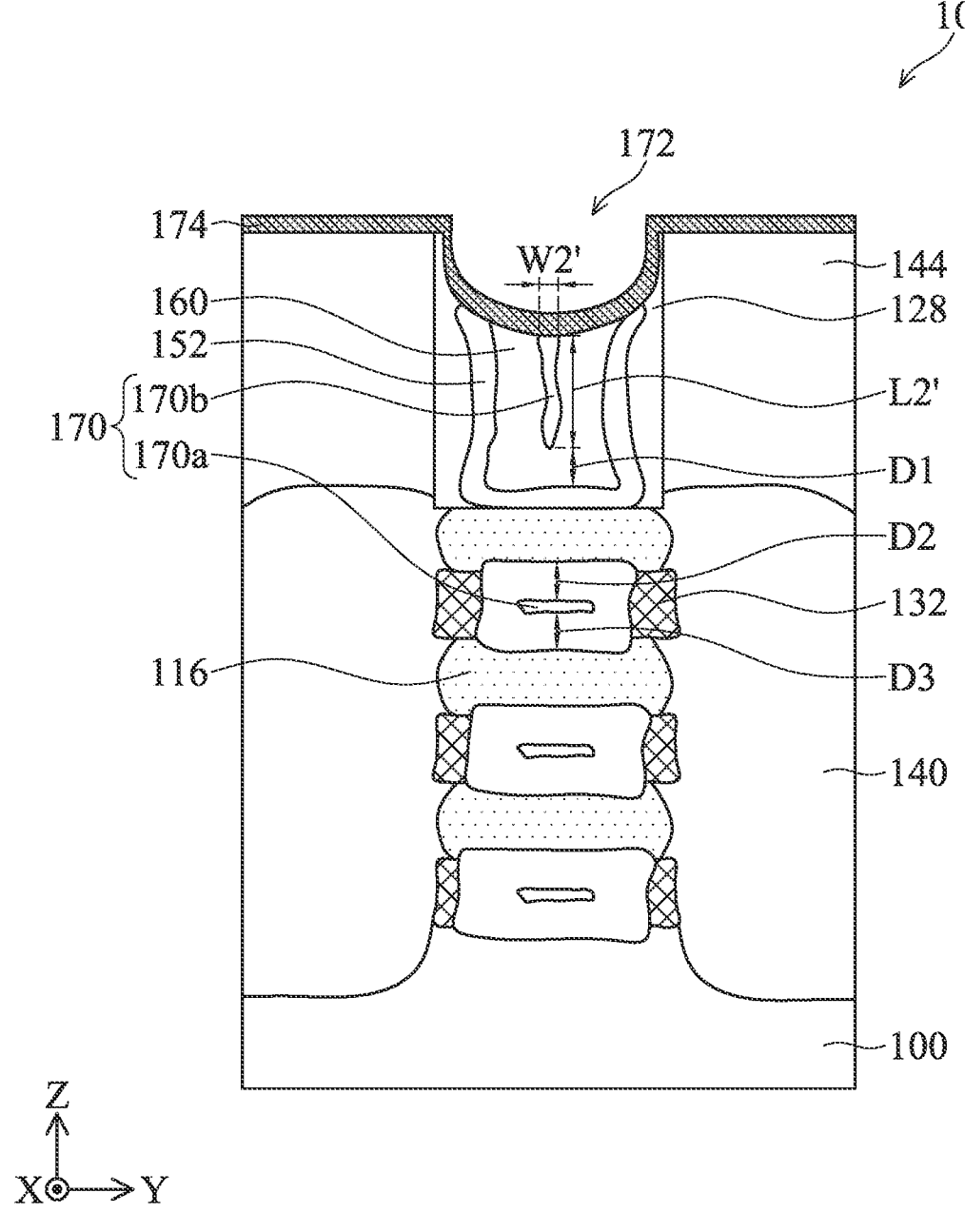

Referring to FIG. 19, a blocking layer 174 is deposited over bottom and sidewall surfaces of the recess 172 and also over the top surfaces of the ILD layer 144. The blocking layer 174 covers the gate dielectric layer 152 and the WFM layer 160, such that the voids 170a and 170b are sealed under then blocking layer 174. The blocking layer 174 blocks impurities from subsequent processes from entering the voids 170a and 170b. The blocking layer 174 may also be referred to as a seal layer or a capping layer.

In some embodiments, the blocking layer 174 is blanket (or conformally) deposited, such as in an ALD process during which precursors for forming the blocking layer 174 are applied in a cyclic fashion. Thickness of the blocking layer 174 may be controlled by tuning the number of deposition cycles performed in a deposition chamber during an ALD process. In some embodiments, a thickness of the blocking layer 174 ranges from about 2 nm to about 10 nm. The blocking layer 174 may include any suitable material, such as an oxygen-containing material (e.g., silicon oxide, silicon oxycarbide, aluminum oxide, aluminum oxynitride, hafnium oxide, titanium oxide, zirconium aluminum oxide, zinc oxide, tantalum oxide, lanthanum oxide, yttrium oxide, silicon oxycarbonitride, etc.), a nitrogen-containing material (e.g., tantalum carbonitride, silicon nitride, zirconium nitride, silicon carbonitride, etc.), a silicon-containing material (e.g., hafnium silicide, silicon, zirconium silicide, etc.), other suitable materials, or combinations thereof. Notably, the composition of the blocking layer 174 is chosen to be distinctly different from the composition of the gate spacers 128 and the gate dielectric layer 152, ensuring sufficient etching selectivity between said layers during subsequent processing steps. In one such example, the blocking layer 174, the gate dielectric layer 152, and the gate spacers 128 may include a metal nitride (e.g., TiN), a metal oxide (e.g., $HfO_2$), and a nitrogen-containing material (e.g., silicon nitride), respectively. The sidewalls and bottom surface of the void 170b constitute the WFM layer 160, while the top surface of the void 170b constitutes the blocking layer 174. In some embodiments, the void 170b sealed under the blocking layer 174 has a width W2' ranging from about 1 nm to about 3 nm and a reduced length L2' ranging from about 2 nm to about 10 nm; a distance D1 between the void 170b and the topmost channel member 116 ranges from about 5 nm to about 10 nm; a distance D2 between the void 170a and the topmost channel member 116 ranges from about 0 to 10 nm; a distance D3 between the void 170a and the middle channel member 116 ranges from about 0 to 10 nm; a sum of the distances D2 and D3 is generally less than 30 nm in various embodiments; of course, the present embodiments are not limited to these dimensions.

In some embodiments, an oxygen treatment may be optionally applied to the top surface of the blocking layer 174. The oxygen treatment increases oxygen atomic concentration in a top portion of the blocking layer 174. An oxygen atomic concentration may gradually decrease from a maximum level at the top surface of the blocking layer 174 to substantially zero at the bottom portion of the blocking layer 174. The maximum oxygen concentration may range from about 0.5% to about 10% in accordance with some embodiments. In an exemplary process, the oxygen treatment is an oxygen-containing plasma treatment under a source power of about 200 W to about 1000 W and a pressure of about 2 mTorr to about 5 mTorr and a temperature of about 50° C. to about 150° C., using a source gas comprising $O_2$, $O_3$, or $H_2O$. The oxygen treatment increases adhesion of the blocking layer 174 to the metal fill layer 176 that will be deposited thereon subsequently. Accordingly, the blocking layer 174 may also be referred to as a glue layer.

Figure 20:
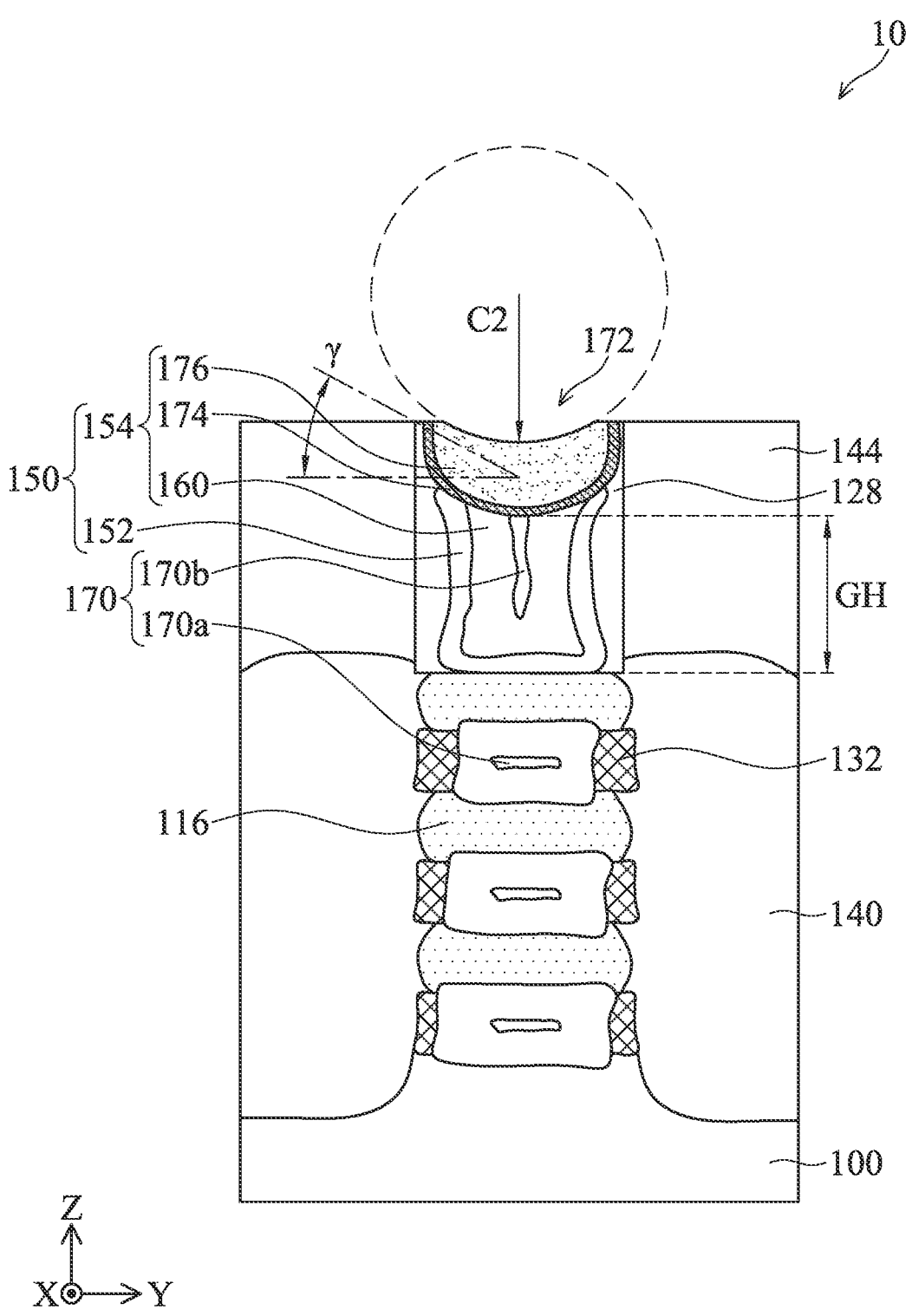

Referring to FIG. 20, a metal fill layer 176 is deposited in the recess 172 and above the blocking layer 174. The horizontal portion of the blocking layer 174 not covered by the metal fill layer 176 is removed in a selective etching process, such as a wet etching process with hydrofluoric acid (HF), a dry etching process, or a combination thereof. The metal fill layer 176 may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. For example, the metal fill layer 176 may be formed from fluorine-free tungsten (FFW). In various embodiments, the metal fill layer 176 may be formed by ALD, PVD, CVD, e-beam evaporation, or other suitable process. The metal fill layer 176 may be deposited over the top surface of the ILD layer 144. A planarization process, such as a CMP process, is performed to remove the excessive portion of the metal layer 176 (as well as the horizontal portion of the blocking layer 174 if not otherwise removed in an etching process beforehand) to expose the top surface of the ILD layer 144. In some embodiments, the top portion of the metal fill layer 176 may optionally be etched back such that a top surface of the metal fill layer 176 has a concave (or dishing) profile. The concave shape that can be approximate by a segment of a circle with a radius C2 in some embodiments. The radius C2 is smaller than C1, ranging from about 5 nm to about 10 nm in some examples. As illustrated in FIG. 20, a dotted line connecting a center point and an edge point of the metal fill layer 176 forms an angle (denoted as $\gamma$) with respect to a horizontal line that ranges from about 10 degrees to about 60 degrees. A thickness of the recessed metal fill layer 176 ranges from about 3 nm to about 20 nm in some embodiments. The thickness of the recessed metal fill layer 176 is generally smaller than the gate height GH in various embodiments. The blocking layer 174 seals the voids 170a and 170b and thus prevents the metallic elements in the metal fill layer 176 and other chemical compounds in subsequent etching and deposition processes from entering the voids 170a and 170b. The WFM layer 160, the blocking layer 174, and the metal fill layer 176 collectively constitute the gate electrode 154. The gate electrode 154 and the gate dielectric layer 152 collectively constitute the gate stack 150.

Referring to FIG. 21, in an alternative embodiment, the horizontal portion of the blocking layer 174 over the top surface of the ILD layer 144 and a vertical portion of the blocking layer 174 over the sidewalls of the gate spacers 128 are removed in a selective etching process, such as a wet etching process with hydrofluoric acid (HF), a dry etching process, or a combination thereof, prior to the deposition of the metal fill layer 176. The selective etching process is controlled by a timer mode, such that the sidewalls of the gate spacers 128 are exposed while a bottom portion of the blocking layer 174 remains covering the top surfaces of the gate dielectric layer 152 and the WFM layer 160. The bottom portion of the blocking layer 174 remains due to its relative larger thickness compared to other portions of the blocking layer 174. The selective etching process thins down the blocking layer 174 for about 40% to about 80% of its thickness. A top portion of the gate spacers 128 also suffers from etching loss such that a thickness W4' of the topmost portion of the gate spacers 128 is smaller than a thickness W3 of a middle portion of the gate spacers 128 that is unetched for about 2 nm to about 5 nm (W4'<W3). Subsequently, the metal fill layer 176 is deposited on the remaining portion of the blocking layer 174. The top portion of the metal fill layer 176 may optionally be etched back to expose sidewalls of the gate spacers 128. The etched back metal fill layer 176 may fully cover or partially cover the blocking layer 174. A coverage ratio of the metal fill layer 176 over the blocking layer 174 ranges from about 70% to about 100% in some embodiments. The top surface of the metal fill layer 176 may have a concave (or dishing) profile. A thickness of the recessed metal fill layer 176 ranges from about 3 nm to about 10 nm in some embodiments. The blocking layer 174 seals the voids 170a and 170b and thus prevents the metallic elements in the metal fill layer 176 and other chemical compounds in subsequent etching and deposition processes from entering the voids 170a and 170b.

It is understood that the configurations depicted in FIGS. 20 and 21 are equally applicable during subsequent operations. For purposes of clarity, however, FIG. 22 is discussed in the context of the embodiment depicted in FIG. 20. Referring to FIG. 22, a gate contact 182, a source/drain contact 184, and a via contact 186 are formed.

In some embodiments, a first patterned mask (not shown) is formed over the ILD layer 144 with an opening above the S/D regions 140. An etching process etches the ILD layer 144 through the opening and exposes the S/D regions 140 in a trench. A silicide feature 180 is formed above the S/D regions 140 in a silicide formation process. The silicide feature 180 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds. Subsequently, the S/D contact 184 is formed in the trench and lands on the silicide feature 180 by depositing a conductive material in the trench. The conductive material may include any suitable material, such as W, Co, Ru, Cu, Ta, Ti, Al, Mo, other suitable conductive materials, or combinations thereof, and may be deposited by any suitable method, such as CVD, PVD, ALD, plating, other suitable methods, or combinations thereof. Alternatively, the silicide formation may be skipped and the S/D contact 184 directly contacts the S/D feature 140.

After the formation of the S/D contact 184, an ILD layer 188 is deposited on the ILD layer 144. In some embodiments, the ILD layer 188 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the ILD layer 188 includes low-k dielectric materials. In some embodiments, the ILD layers 144 and 188 include different dielectric materials. The ILD layer 188 may be formed to a suitable thickness by FCVD, CVD, HDPCVD, SACVD, spin-on, sputtering, or other suitable methods. In the illustrated embodiment, a portion of the ILD layer 188 is deposited on the concave top surface of the metal fill layer 176 and thus below a top surface of the ILD layer 144.

After the formation of the ILD layer 188, a second patterned mask (not shown) is formed over the ILD layer 188 with openings above the S/D contact 184 and the metal fill layer 176, respectively. An etching process etches through the ILD layer 188 through the openings and exposes the S/D contact 184 and the metal fill layer 176 in the trenches. Subsequently, the via contact 186 and the gate contact 182 are formed in the trenches and land on the S/D contact 184 and the metal fill layer 176, respectively, by depositing conductive material in the trenches. The conductive material may include any suitable material, such as W, Co, Ru, Cu, Ta, Ti, Al, Mo, other suitable conductive materials, or combinations thereof, and may be deposited by any suitable method, such as CVD, PVD, ALD, plating, other suitable methods, or combinations thereof. The conductive material in forming the via contact 186 and the gate contact 182 may be different from the conductive material in forming the S/D contact 184. Subsequently, a planarization process, such as a CMP process, is performed to remove excessive conductive material and expose the ILD layer 188.

FIG. 23 illustrates a fragmentary cross-sectional view of the semiconductor device 10 in FIG. 15 taken along the line B-B'. For a clearer view, only channel members 116, gate dielectric layer 152, WFM layer 160, blocking layer 174, metal fill layer 176, gate contact 182, and voids 170 are shown. Although other features still exist. The channel members 116 at the bottom generally have a larger width than the ones on the top. A width of the channel members 116 along the X-direction ranges from about 20 nm to about 50 nm in some embodiments. A thickness of the channel members 116 along the Z-direction ranges from about 5 nm to about 10 nm. A height from the top surface of the topmost channel member 116 to a bottom surface of the gate dielectric layer 152 (denoted as H) ranges from about 40 nm to about 80 nm. A distance between opposing sidewalls of the gate dielectric layer 152 (denoted as D) ranges from about 40 nm to about 80 nm. A distance between the topmost channel member 116 and a bottom surface of the gate contact 182 (denoted as T) ranges from about 5 nm to about 20 nm, which is also larger than a thickness of the channel member 116 in some embodiments. The top surface of the WFM layer 160 has a concave (or dishing) profile due to the etch back process. The blocking layer 174 and the metal fill layer 176 also exhibit concave (or dishing) profiles, respectively. A vertex of the concave shape may be offset from a center of the gate electrode, such that the top surfaces of the metal fill layer 176 form an angle (denoted as Agl. 1) ranges from about 110 degrees to about 170 degrees; an outer sidewall of the metal fill layer 176 forms an angle (denoted as Agl. 2) with respect to a vertical direction that ranges from about 10 degrees to about 40 degrees; and the outer sidewall of the metal fill layer 176 forms an angle with respect to an outer sidewall of the blocking layer 174 (denoted as Agl. 3) that ranges from about 10 degree to about 60 degrees. Also as shown in FIG. 23, the voids 170a extends horizontally between adjacent channel members 116 and the voids 170b extends vertically aside of the channel members 116. Some voids 170b may extend below the bottom surface of the bottommost channel member 116 and above the top surface of the topmost channel member 116. Further, some voids 170a and some voids 170b may connect and form a larger void 170 that surrounds the stack of the channel members 116 on three sides.

Although not intended to be limiting, one or more embodiments of the present disclosure provide many benefits to a semiconductor device and the formation thereof. For example, embodiments of the present disclosure provide a blocking layer seals the voids that are formed during the deposition of the WFM layer. The blocking layer blocks impurities from entering the voids, which increases device performance uniformity. Furthermore, the forming of the blocking layer can be easily integrated into existing semiconductor fabrication processes.

In one exemplary aspect, the present disclosure is directed to a method of manufacturing a semiconductor device. The method includes alternately stacking first semiconductor layers and second semiconductor layers over a substrate, patterning the first and second semiconductor layers into a fin structure, forming a dielectric layer across the fin structure, removing the first semiconductor layers of the fin structure thereby forming gaps between the second semiconductor layers of the fin structure, depositing a first metal layer to wrap around the second semiconductor layers, wherein voids are formed between opposing sidewalls of the dielectric layer, recessing the first metal layer, forming a blocking layer over the recessed first metal layer thereby covering the voids, and depositing a second metal layer over the blocking layer. In some embodiments, the method further includes recessing the second metal layer, and forming a metal contact landing on the recessed second metal layer. In some embodiments, a bottom surface of the metal contact is below top portions of the dielectric layer. In some embodiments, the depositing of the first metal layer covers the opposing sidewalls of the dielectric layer, and the recessing of the first metal layer reveals top portions of the opposing sidewalls of the dielectric layer. In some embodiments, the recessing of the first metal layer also thins a thickness of the dielectric layer. In some embodiments, the forming of the blocking layer includes depositing a blanket layer over the semiconductor device, and removing portions of the blanket layer outside the opposing sidewalls of the dielectric layer. In some embodiments, the forming of the blocking layer further includes removing portions of the blanket layer deposited on the opposing sidewalls of the dielectric layer thereby revealing top portions of the opposing sidewalls. In some embodiments, the blanket layer comprises metal nitride. In some embodiments, the first metal layer is configured to adjust a work function of the semiconductor device.

In another exemplary aspect, the present disclosure is directed to a method of fabricating a semiconductor device. The method includes forming vertically stacked channel members suspended above a substrate, forming a strained material abutting opposing ends of the channel members, depositing a work function metal layer wrapping around the channel members, wherein gaps between the channel members are shrunk after the depositing of the work function metal layer but still remain, partially removing the work function metal layer, forming a blocking layer on the work function metal layer, wherein the blocking layer seals the gaps thereunder, and depositing a metal fill layer on the blocking layer. In some embodiments, the method further includes performing an oxygen treatment to a top surface of the blocking layer. In some embodiments, the method further includes forming a dielectric layer interposing the work function metal layer and the strained material, and prior to the depositing of the work function metal layer, depositing a gate dielectric layer wrapping around the channel members, the gate dielectric layer being in direct contact with the dielectric layer. In some embodiments, the work function metal layer includes an n-type metal layer discretely deposited on the gate dielectric layer. In some embodiments, the partially removing of the work function metal layer also partially removes the gate dielectric layer. In some embodiments, the gaps include a first gap extending vertically above a topmost channel member, and the blocking layer caps a top opening of the first gap. In some embodiments, the gaps include a second gap extending horizontally between two adjacent channel members. In some embodiments, the method further includes forming an interlayer dielectric layer over the strained material, and recessing the metal fill layer, such that a top surface of the metal fill layer is below a top surface of the interlayer dielectric layer.

In yet another exemplary aspect, the present disclosure is directed to a semiconductor device. The semiconductor device includes semiconductor channel members vertically stacked over a substrate, a gate stack wrapping around the semiconductor channel members, wherein the gate stack includes a first metal layer, a second metal layer, a blocking layer sandwiched by the first metal layer and the second metal layer, and voids stacked between the first metal layer and the blocking layer, a source/drain (S/D) epitaxial feature in contact with the semiconductor channel members, an insulating layer interposing the S/D epitaxial feature and the gate stack, and gate spacers disposed on sidewalls of the gate stack, wherein the first metal layer is below a top surface of the gate spacers. In some embodiments, the voids include a first void extending vertically above a topmost semiconductor channel member and a second void extending horizontally below the topmost semiconductor channel member. In some embodiments, a top surface of the first metal layer has a concave profile.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    alternately stacking first semiconductor layers and second semiconductor layers over a substrate;
    patterning the first and second semiconductor layers into a fin structure;
    forming a dielectric layer across the fin structure;
    removing the first semiconductor layers of the fin structure thereby forming gaps between the second semiconductor layers of the fin structure;
    depositing a first metal layer to wrap around the second semiconductor layers, wherein voids are formed between opposing sidewalls of the dielectric layer;
    recessing the first metal layer;
    forming a blocking layer over the recessed first metal layer thereby covering the voids; and
    depositing a second metal layer over the blocking layer.

2. The method of claim 1, further comprising:
    recessing the second metal layer; and
    forming a metal contact landing on the recessed second metal layer.

3. The method of claim 2, wherein a bottom surface of the metal contact is below top portions of the dielectric layer.

4. The method of claim 1, wherein the depositing of the first metal layer covers the opposing sidewalls of the dielectric layer, and the recessing of the first metal layer reveals top portions of the opposing sidewalls of the dielectric layer.

5. The method of claim 1, wherein the recessing of the first metal layer also thins a thickness of the dielectric layer.

6. The method of claim 1, wherein the forming of the blocking layer includes:
    depositing a blanket layer over the semiconductor device; and
    removing portions of the blanket layer outside the opposing sidewalls of the dielectric layer.

7. The method of claim 6, wherein the forming of the blocking layer further includes:

removing portions of the blanket layer deposited on the opposing sidewalls of the dielectric layer thereby revealing top portions of the opposing sidewalls.

8. The method of claim 6, wherein the blanket layer comprises metal nitride.

9. The method of claim 1, wherein the first metal layer is configured to adjust a work function of the semiconductor device.

10. A method, comprising:
    forming vertically stacked channel members suspended above a substrate;
    forming a strained material abutting opposing ends of the channel members;
    depositing a work function metal layer wrapping around the channel members, wherein the depositing of the work function metal layer forms a seam above a topmost one of the channel members, and wherein gaps between the channel members are shrunk after the depositing of the work function metal layer but still remain;
    partially removing the work function metal layer;
    forming a blocking layer on the work function metal layer, wherein the blocking layer seals the seam; and
    depositing a metal fill layer on the blocking layer.

11. The method of claim 10, further comprising:
    performing an oxygen treatment to a top surface of the blocking layer.

12. The method of claim 10, further comprising:
    forming a dielectric layer interposing the work function metal layer and the strained material; and
    prior to the depositing of the work function metal layer, depositing a gate dielectric layer wrapping around the channel members,
    wherein the gate dielectric layer is in direct contact with the dielectric layer.

13. The method of claim 12, wherein the work function metal layer includes an n-type metal layer discretely deposited on the gate dielectric layer.

14. The method of claim 12, wherein the partially removing of the work function metal layer also partially removes the gate dielectric layer.

15. The method of claim 10, wherein the seam extends vertically above the topmost one of the channel members.

16. The method of claim 15, wherein at least one of the gaps extends horizontally between two adjacent channel members.

17. The method of claim 10, further comprising:
    forming an interlayer dielectric layer over the strained material; and
    recessing the metal fill layer, such that a top surface of the metal fill layer is below a top surface of the interlayer dielectric layer.

18. A method, comprising:
    forming a stack of channel layers and sacrificial layers alternately stacked;
    patterning the stack to form a fin-shape structure;
    forming a sacrificial gate structure across the fin-shape structure;
    depositing a gate spacer layer on sidewalls of the sacrificial gate structure;
    removing the sacrificial gate structure to form a gate trench exposing opposing sidewalls of the gate spacer layer;
    removing the sacrificial layer from the gate trench to release the channel layers as channel members;

depositing a work function metal layer wrapping around the channel members, wherein a void is formed between the opposing sidewalls of the gate spacer layer;

recessing the work function metal layer;

forming a blocking layer over the recessed work function metal layer to cap the void;

depositing a metal fill layer over the blocking layer;

recessing the metal fill layer; and forming a gate contact landing on the recessed metal fill layer.

19. The method of claim 18, further comprising:

performing an oxygen treatment to increase an oxygen concentration in a top portion of the blocking layer.

20. The method of claim 18, wherein after the depositing of the metal layer, a top surface of the blocking layer remains exposed.

\* \* \* \* \*